United States Patent
Lam et al.

(10) Patent No.: US 10,877,729 B2
(45) Date of Patent: Dec. 29, 2020

(54) RECONFIGURABLE SEGMENTED SCALABLE SHIFTER

(71) Applicant: Hong Kong Applied Science and Technology Research Institute Co., Ltd., Shatin (HK)

(72) Inventors: Hing-Mo Lam, Tseung Kwan O (HK); Man-Wai Kwan, Shatin (HK); Ching-Hong Leung, Tai Po (HK); Kong-Chau Tsang, Kowloon (HK)

(73) Assignee: Hong Kong Applied Science and Technology Research Institute Co., Ltd., Shatin (HK)

( * ) Notice: Subject to any disclaimer, the term of this patent is extended or adjusted under 35 U.S.C. 154(b) by 166 days.

(21) Appl. No.: 16/264,070

(22) Filed: Jan. 31, 2019

(65) Prior Publication Data
US 2020/0249909 A1    Aug. 6, 2020

(51) Int. Cl.
*G06F 5/01*    (2006.01)
*G06F 9/30*    (2018.01)
(Continued)

(52) U.S. Cl.
CPC .......... *G06F 5/015* (2013.01); *G06F 9/30032* (2013.01); *G06F 9/3889* (2013.01); *H03M 13/116* (2013.01)

(58) Field of Classification Search
None
See application file for complete search history.

(56) References Cited

U.S. PATENT DOCUMENTS

| 5,650,781 A | 7/1997 | Park |
| 7,814,393 B2 | 10/2010 | Kyung et al. |
| (Continued) | | |

FOREIGN PATENT DOCUMENTS

| CN | 1454347 A | 11/2003 |
| CN | 107370489 A | 11/2017 |
| (Continued) | | |

OTHER PUBLICATIONS

Das, S. et al. "A Timing-Driven Approach to Synthesize Fast Barrel Shifters," IEEE Transactions on Circuits and Systems-II: Express Briefs, vol. 55, No. 1, Jan. 2008, 5 pages.
(Continued)

*Primary Examiner* — Michael D. Yaary
(74) *Attorney, Agent, or Firm* — Norton Rose Fulbright US LLP

(57) ABSTRACT

Systems and methods that provide reconfigurable shifter configurations supporting multiple instruction, multiple data (MIMD) are described. Shifters implemented according to embodiments support multiple data shifts with respect to an instance of data shifting, wherein multiple individual different data shifts are implemented at a time in parallel. Reconfigurable segmented scalable shifters of embodiments, in addition being reconfigurable for scalability in supporting data shifting with respect to various bit lengths of data, are configured to support data shifting of differing bit lengths in parallel. The data shifters of embodiments implement segmentation for facilitating data shifting with respect to differing bit lengths. Different data shift commands may be provided with respect to each such segment, thereby facilitating multiple data shifts in parallel with respect to various bit lengths of data. Reconfigurable segmented scalable shifter configurations provide for fully reconfigurable data width and shift command of each message of input data.

34 Claims, 28 Drawing Sheets

(51) Int. Cl.
*G06F 9/38* (2018.01)
*H03M 13/11* (2006.01)

(56) References Cited

U.S. PATENT DOCUMENTS

| | | | |
|---|---|---|---|
| 8,612,835 | B2 | 12/2013 | Yokokawa |
| 8,713,399 | B1 | 4/2014 | Tsatsaragkos et al. |
| 8,739,001 | B2 | 5/2014 | Tsatsaragkos et al. |
| 9,112,530 | B2 | 8/2015 | Gunnam et al. |
| 9,537,510 | B2 | 1/2017 | Motozuka et al. |
| 9,933,996 | B2 | 4/2018 | Chaudhuri |
| 2009/0274138 | A1 | 11/2009 | Glickman et al. |
| 2010/0179975 | A1* | 7/2010 | Liao ............... G06F 5/015 708/209 |
| 2015/0229330 | A1 | 8/2015 | Motozuka et al. |

FOREIGN PATENT DOCUMENTS

| | | |
|---|---|---|
| WO | WO-2018029633 A1 | 2/2018 |
| WO | WO-2018127196 A1 | 7/2018 |

OTHER PUBLICATIONS

Chen, X. et al. "QSN—A Simple Circular-Shift Network for Reconfigurable Quasi-Cyclic LDPC Decoders," IEEE Transactions on Circuits and Systems-II: Express Briefs, vol. 57, No. 10, Oct. 2010, 5 pages.

Hong, J.-H. et al. "Parallel LDPC Decoding on a Heterogeneous Platform Using OpenCL," KSII Transactions on Internet and Information Systems, vol. 10, No. 6, Jun. 2016, 21 pages.

International Search Report and Written Opinion issued for PCT Application No. PCT/CN2019/074532, dated Oct. 30, 2019, 10 pages.

Mediatek Inc., "On Design and Performance of NR eMBB LDPC Code" R1-1707850, May 15, 2017; 15 pages.

International Search Report and Written Opinion issued for PCT Application No. PCT/CN2019/074599, dated Jul. 5, 2019, 9 pages.

Tsatsaragkos et al. "A Reconfigurable LDPC Decoder Optimized for 802.11n/ac Applications," IEEE Transactions on VLSI Systems, vol. 26, No. 1, Jan. 2018, 14 pages.

Karkooti et al. "Semi-Parallel Reconfigurable Architectures for Real-Time LDPC Decoding," IEEE Proceedings of the International Conference on Information Technology: Coding and Computing, 2004, 7 pages.

Sun et al. "A Low-Power 1-Gbps Reconfigurable LDPC Decoder Design for Multiple 4G Wireless Standards," IEEE International SOC Conference, 2008, 4 pages.

Liu et al. "Design of a Multimode QC-LDPC Decoder Based on Shift-Routing Network," IEEE Transactions on Circuits and Systems, vol. 56, No. 9, Sep. 2009, 5 pages.

Oh et al. "Area Efficient Controller Design of Barrel Shifters for Reconfigurable LDPC Decoders," IEEE International Symposium on Conference: Circuits and Systems, 2008, 4 pages.

\* cited by examiner

RECONFIGURABLE SEGMENTED SCALABLE SHIFTER

CROSS-REFERENCE TO RELATED APPLICATIONS

The present application is related to commonly assigned U.S. patent application Ser. No. 16/264,161 filed Jan. 31, 2019 and issued on Nov. 3, 2020 as U.S. Pat. No. 10,826, 529, entitled "PARALLEL LDPC DECODER," the disclosure of which is hereby incorporated by reference herein in its entirety as if fully set forth below for all applicable purposes.

TECHNICAL FIELD

The present invention relates generally to data shifting and, more specifically, to reconfigurable shifters.

BACKGROUND OF THE INVENTION

A shifter is often an important element in digital signal processing. For example, shifters are used for a variety of applications such as channel decoder (e.g. 5G Quasi-Cyclic Low-Density Parity Check (QC-LDPC) decoder), Arithmetic Logic Unit (ALU) of CPU, Coordinate Rotation Digital Computer (CORDIC) processor, data encryption (e.g. Rijndael algorithm), etc.

There are three main types of data shifting as may be provided using shifters. FIG. 1 shows bit shift examples for an eight-bit ALU for arithmetic shift, logical shift, and cyclic shift types of data shifting. The data shifting type examples of FIG. 1 illustrated data shifting for both left and right shifts.

It can be appreciated from the examples shown in FIG. 1 that data shifting provided by a shifter involves more than simply shifting data bits to the left or right. For example, in implementing an arithmetic shift, the input is a signed number (e.g., in the illustrated 8-bit example, bit [7] is a sign-bit) and a sign bit is inserted as the leftmost bit when the bits are shifted to the right. Alternatively, a "0" bit is inserted as the rightmost bit when the bits are shifted to the left in implementing an arithmetic shift. In implementing a logical shift, a "0" bit is inserted as the rightmost bit when the bits are shifted to the left and as the leftmost bit when the bits are shifted to the right. In implementing a cyclic shift, a bit leftmost bit is inserted as the rightmost bit when the bits are shifted to the left and a rightmost bit is inserted as the leftmost bit when the bits are shifted to the right. Accordingly, circuitry configured for implementing data shifting can be somewhat complicated, particularly if configured to accommodate multiple types of data shifting.

Traditional shifters support a single shifting command with respect to an instance of data shifting. For example, a common configuration of a traditional shifter is the single instruction, single data (SISD) implementation illustrated in FIG. 2A. In operation of a SISD shifter, a single shift command (CMD) is provided with respect to input data (X, such as may comprise bits [7:0] of the eight-bit examples of FIG. 1) for implementing a data shift and generating corresponding output data (Y, such as may comprise bits [7:0] shifted in accordance with CMD). Another common configuration of a traditional shifter is the single instruction, multiple data (SIMD) implementation illustrated in FIG. 2B. In operation of a SIMD shifter, a single shift command (CMD) is provided with respect to multiple input data ($X\_1$, $X\_2$, ... $X\_M$, such as may each comprise bits [7:0] of the eight-bit examples of FIG. 1) for implementing a same data shift with respect to each such input and generating corresponding output data ($Y\_1$, $Y\_2$, ... $Y\_M$, such as may each comprise bits [7:0] shifted in accordance with CMD). Such traditional shifters do not support multiple data shift commands allowing individual, multiple different data shifting to be implemented in parallel (e.g., providing different data shifts with respect to multiple input data, such as each of $X\_1$, $X\_2$, ... $X\_M$).

Reconfigurable scalable shifter configurations have been implemented to accommodate data shifting with respect to data of different bit sizes. FIG. 3 illustrates scalable operation of a typical reconfigurable shifter implementation for an example in which the shifter accommodates up to eight-bit data shifting and an instance of data shifting involves five-bit data. Logic circuitry of such traditional reconfigurable scalable shifters is designed based on the longest bit length of input data that the shifter can handle. In operation, portions of the logic circuitry are idle when processing input data with shorter bit lengths. For example, as shown in FIG. 3, although the shifter is reconfigurable to accommodate data shifting with respect to less than the full complement of data bits supported by the shifter, that portion of the shifter not needed for data shifting with respect to the scaled-down input remains idle during the particular instance of data shifting (e.g., circuitry with respect to data bit positions [7:5] remain idle while circuitry with respect to data bit positions [4:0] perform shifting with respect to 5-bit input data). It can be readily appreciated that hardware resources in the shifter may be appreciably underutilized as the bit length of input data varies depending on the applications.

Specific examples of prior shifter configurations may be found in U.S. Pat. Nos. 9,537,510 and 8,713,399. The shifters of U.S. Pat. No. 9,537,510 provide implementations in which multiple shifter stages cooperate to provide SISD configurations supporting variable shift values with respect to input data of M bits. The shifters therein do not, however, support parallel segmented data with variable size. The shifters of U.S. Pat. No. 8,713,399 provide implementations in which SIMD configurations support data shifts with respect to multiple input data of pre-determined data sizes. For example, a same shift command is implemented for providing data shifting with respect to a group of three input messages (i.e., n=3), a group of six input messages (i.e., n=6), or a group of nine input messages (i.e., n=9). The shifters therein do not, however, support all possible data size values, and instead support only the pre-determined data sizes. Moreover, the same data shift is implemented with respect to each input message of a group.

BRIEF SUMMARY OF THE INVENTION

The present invention is directed to systems and methods provide reconfigurable shifter configurations supporting multiple instruction, multiple data (MIMD). Shifters implemented according to embodiments of the invention support multiple data shifts with respect to an instance of data shifting, wherein multiple individual different data shifts are implemented at a time in parallel. In operation according to embodiments, multiple data shift commands may be utilized such that a plurality of data (e.g., each message of the input data) can have an individual shifting command to thereby implement different data shifting with respect to each such data.

MIMD shifters implemented according to embodiments of the present invention provide reconfigurable segmented scalable shifter configurations. Reconfigurable segmented scalable shifters of embodiments, in addition being reconfigurable for scalability in supporting data shifting with respect to various bit lengths of data, are configured to support data shifting of differing bit lengths in parallel. For example, messages of differing bit lengths may be provided individual data shifting in parallel. Accordingly, inputs of a reconfigurable segmented scalable shifter of embodiments may comprise a mix of inputs of different sizes.

The data shifters of embodiments implement segmentation for facilitating data shifting with respect to differing bit lengths. For example, one or more messages from input data may be provided data shifting in each segment of a reconfigurable segmented scalable shifter. In operation according to embodiments, the segmentation of a reconfigurable segmented scalable shifter utilizes an otherwise idle portion of logic for data shifting of other input data. Different data shift commands may be provided with respect to each such segment, thereby facilitating multiple data shifts in parallel with respect to various bit lengths of data.

Reconfigurable segmented scalable shifter configurations provide for fully reconfigurable data width and shift command of each message of input data. For example, shifters of embodiments are reconfigurable with respect to a number of segments (M) (e.g., 1≤M≤N), a size of each segment (N_m) (e.g., N≥N_m≥2), a shift value of each segment (S) (0≤S≤N), a shift direction (D) of each segment (e.g., D is left or right), and/or a shift type (T) of each segment (e.g., T is logical, arithmetic, or cyclic). Such reconfigurable segmented scalable shifters in accordance with concepts of the present invention provide flexible and efficient utilization of hardware for parallel processing data input of various bit lengths.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with the accompanying drawings, in which.

DETAILED DESCRIPTION OF THE INVENTION

Figure 1:
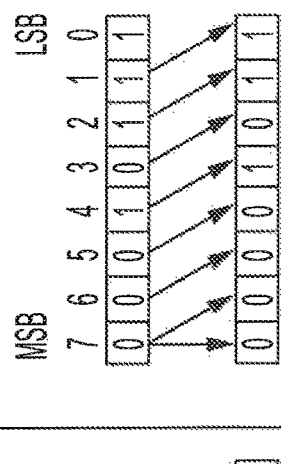
FIG. 1 shows data shifting type examples for both left and right data shifts.
Figure 2A:
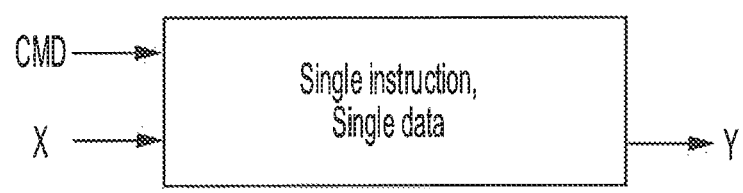
FIGS. 2A and 2B show single instruction shifters of the prior art.
Figure 2B:
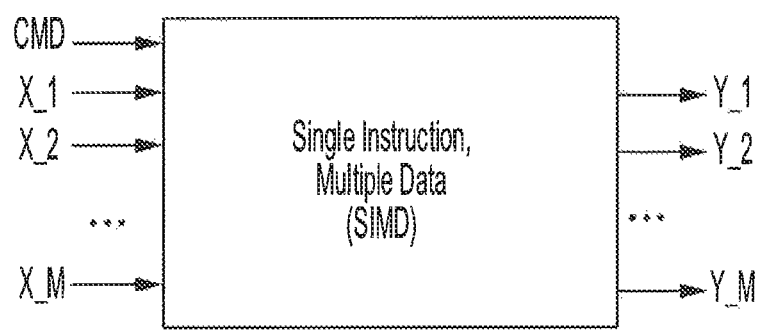
Figure 3:
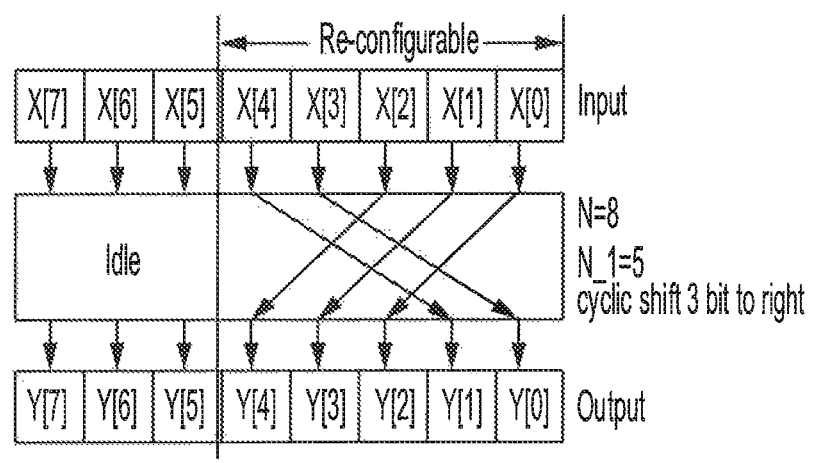
FIG. 3 shows scalable operation of a typical reconfigurable shifter implementation of the prior art.
Figure 4A:
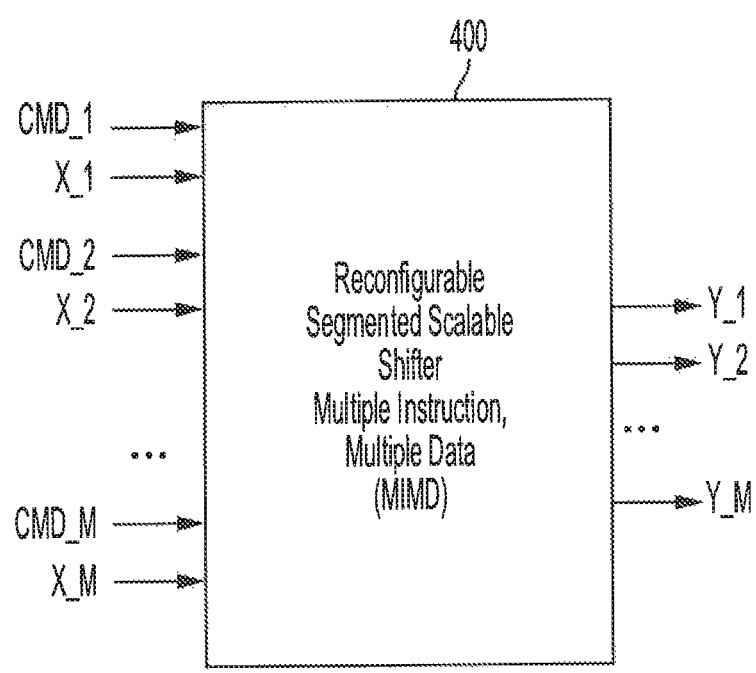
FIGS. 4A and 4B show multiple instruction multiple data implementations of a reconfigurable segmented scalable shifter according to embodiments of the invention.

FIG. 4A shows reconfigurable segmented scalable shifter 400 of embodiments of the invention. Reconfigurable segmented scalable shifter 400 provides a reconfigurable shifter configuration supporting multiple instruction, multiple data (MIMD). In particular, input data (X) supplied to reconfigurable segmented scalable shifter 400 comprises a number of messages (M), shown as messages X_1, X_2, ... X_M, wherein multiple individual different data shifts may be implemented at a time in parallel with respect to these messages to provide output data (Y) comprising M messages, shown as messages Y_1, Y_2, ... Y_M, having shifted data. Accordingly, multiple data shift commands (e.g., CMD_1, CMD_2, ... CMD_M) are shown in association with the messages of the input data. In operation according to embodiments, each message of the input data (e.g., X_1, X_2, ... X_M) may have an individual shift implemented with respect thereto in accordance with a corresponding one of the data shift commands (e.g., CMD_1→X_1, CMD_2→X_2, ... CMD_M→X_M) to thereby facilitate different data shifting with respect to each output message (e.g., Y_1, Y_2, ... Y_M).

Figure 4B:
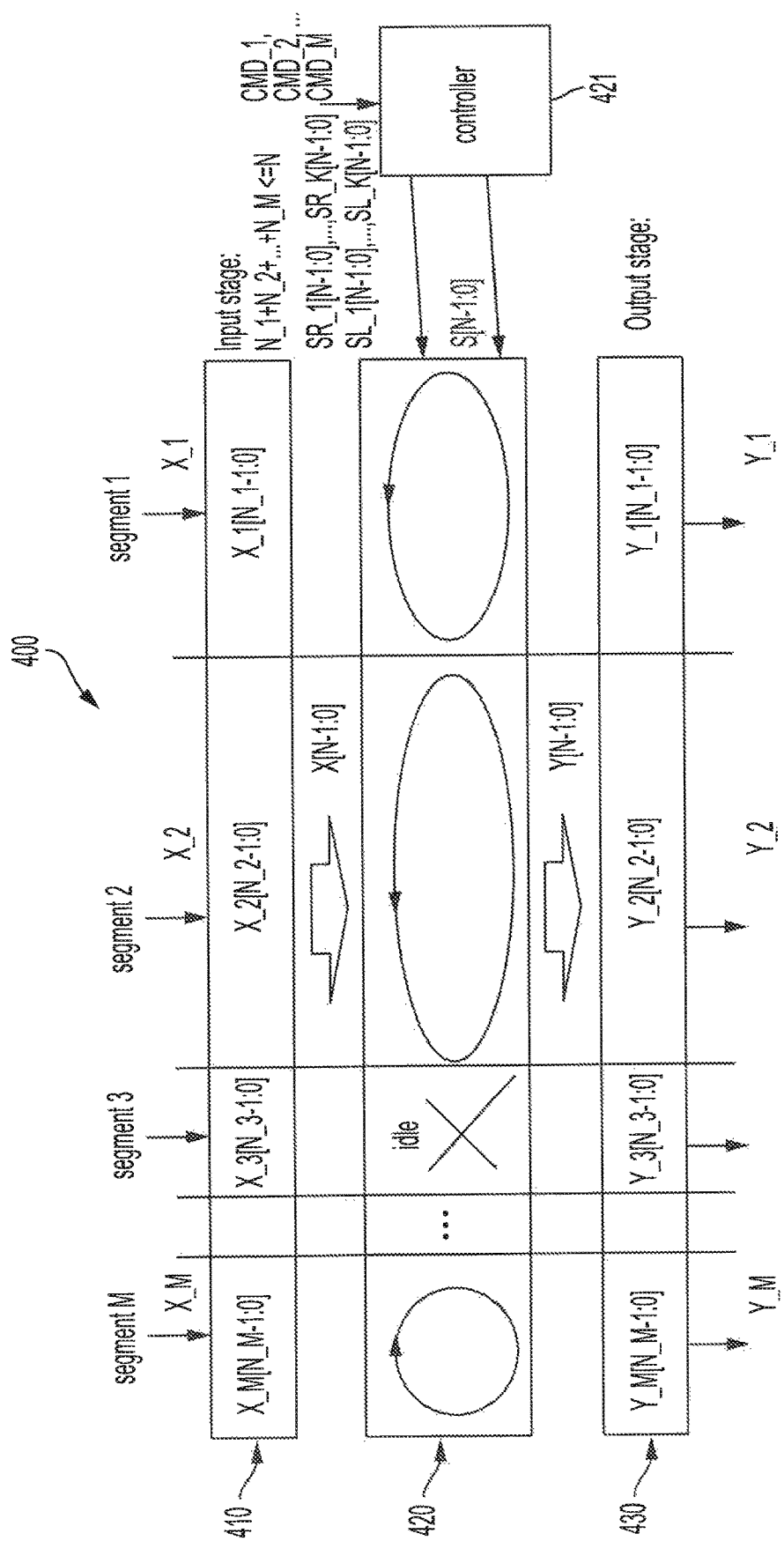

The segmentation configuration implemented according to the embodiments of reconfigurable segmented scalable shifter 400 facilitates utilizing idle portion of logic for the shift of additional input data. FIG. 4B shows additional detail with respect to reconfigurable segmented scalable shifter 400, including the segmentation configuration thereof, in accordance with embodiments of the invention. In particular, reconfigurable segmented scalable shifter 400 shown in FIG. 4B includes input stage 410, shifter stage 420, and output stage 430 implementing a segmentation configuration.

Input stage 410 may, for example, comprise configurable memory elements (e.g., random access memory (RAM), flash memory, magnetic memory, optical memory, etc.) and/or controllable data paths (e.g., controllable data path elements) suitable for storage of the data of messages input to reconfigurable segmented scalable shifter 400 for which shifting is provided and for controllably associating such data with reconfigurable segments of shifter stage 420. As will be better understood from the discussion which follows, input stage 410 is utilized to associate the one or more messages (e.g., X_1, X_2, ... X_M) of the input data (X) with corresponding segments of shifter stage 420. For example, in the illustrated embodiment, the input data (X) includes messages X_1, X_2, X_3, ... X_M, wherein input stage 410 facilitates correspondence of the N_1 number of bits of message X_1 (e.g., bits 0 to N_1−1 of message X_1) to segment 1 of shifter stage 420, correspondence of the N_2 number of bits of message X_2 (e.g., bits 0 to N_2−1 of message X_2) to segment 2 of shifter stage 420, correspondence of the N_3 number of bits of message X_3 (e.g., bits 0 to N_3−1 of message X_3) to segment 3 of shifter stage 420, and correspondence of the N_M number of bits of message X_M (e.g., bits 0 to N_M−1 of message X_M) to segment M of shifter stage 420.

Shifter stage 420 may, for example, comprise controllable data path elements (e.g., multiplexers and associated control elements) suitable for implementing data shifts. Such data path elements of embodiments may implement various shifter architectures, such as logarithmic shifter configurations, barrel shifter configurations, combinational shifter configurations, etc. As will be better understood from the discussion below, shifter stage 420 provides reconfigurable, scalable segments that are utilized in implementing data shifting in parallel with respect to multiple messages of input data. Controller 421 of shifter stage 420 is shown in the illustrated embodiment for providing individual shifting commands to the segments of shifter stage 420 in accordance with data shift commands (e.g., CMD_1, CMD 2, ... CMD_M) provided in association with the input data (e.g., X=X_1, X_2, X_3, ... X_M). Data shifting is independently provided by segments (e.g., left cyclic by segment 1, left cyclic by segment 2, and right cyclic by segment M) of shifter stage 420 in accordance with the respective data shift commands to thereby implement multiple individual different data shifts at a time in parallel.

It should be appreciated that, although implementation of cyclic shifts are illustrated in the example of FIG. 4B, embodiments may implement various data shifting types (e.g., arithmetic shift, logical shift, and/or cyclic shift), whether by all segments or in various different combinations by the segments. Moreover, one or more segments may be configured so as to provide no data shifting operation in any instance of data shifting by reconfigurable segmented scalable shifter 400. For example, segment 3 shown in the exemplary embodiment of FIG. 4B is unused for data shifting (e.g., idle or configured to pass data bits straight through without shifting) in the data shifting instance illustrated. Such unused segments may, for example, be used in situations where the messages (X_1, X_2, ... X_M) of the input data (X) comprise fewer bits in the aggregate than are accommodated by the particular implementation of reconfigurable segmented scalable shifter 400. The location of such unused segments may be anywhere within the reconfigurable segmented scalable shifter of embodiments, such as to conveniently accommodate various message lengths, to facilitate a segment starting with the least significant bit (LSB) of a respective message, etc., as will be better understood from the discussion which follows.

Reconfigurable segmented scalable shifter 400 of embodiments is configured to be reconfigurable with respect to data width and/or shift command of each message of input data. For example, as shown in further detail below, shifter stage 420 of embodiments is reconfigurable with respect to the number of segments (M) (e.g., $1 \leq M \leq N$), the size of each segment (N_m) (e.g., $N \geq N\_m \geq 2$), the shift value (S) of each segment (S_m) ($0 \leq S\_m \leq N$), the shift direction (D) of each segment (D_m) (e.g., D_m is left or right), and/or the shift type (T) of each segment (T_m) (e.g., T_m is logical, arithmetic, or cyclic), any or all of which may be controlled by controller 421. The individual data shift commands (e.g., CMD_1, CMD_2, ... CMD_M) provided to reconfigurable segmented scalable shifter 400 (e.g., to controller 421) of embodiments may include various such information (e.g., the size of the respective segment (N_m), the shift value of the respective segment (S_m), the shift direction of the respective segment (D_m), the shift type of the respective segment (T_m), etc.). Additionally or alternatively, one or more general data shift commands (e.g., CMD, not shown in the illustrated embodiment) including various such information (e.g., the number of segments (M), the size of each segment (N_m), a globally applicable shift value (S), a globally applicable shift direction (D), a globally applicable shift type (T), etc.) may be provided to reconfigurable segmented scalable shifter 400 (e.g., to controller 421) of embodiments for controlling aspects generally applicable to the shifter and/or segments thereof.

Output stage 430 may, for example, comprise configurable memory elements (e.g., RAM, flash memory, magnetic memory, optical memory, etc.) and/or controllable data paths (e.g., controllable data path elements) suitable for controllably associating reconfigurable segments of shifter stage 420 with messages of output data for storage of the shifted data of the messages for which shifting is provided. As will be better understood from the discussion which follows, output stage 430 is utilized to associate segments of shifter stage 420 with the one or more messages (e.g., Y_1, Y_2, ... Y_M) of the output data (Y). For example, in the illustrated embodiment, the output data (Y) includes messages Y_1, Y_2, Y_3, ... Y_M, wherein output stage 430 facilitates correspondence of the N_1 number of the shifted bits of message Y_1 (e.g., bits 0 to N_1−1 of message Y_1) to segment 1 of shifter stage 420, correspondence of the N_2 number of shifted bits of message Y_2 (e.g., bits 0 to N_2−1 of message Y_2) to segment 2 of shifter stage 420, correspondence of the N_3 number of un-shifted bits of message Y_3 (e.g., bits 0 to N_3−1 of message Y_3) to segment 3 (idle in this illustrated example) of shifter stage 420, and correspondence of the N_M number of shifted bits of message Y_M (e.g., bits 0 to N_M−1 of message Y_M) to segment M of shifter stage 420.

In order to aid in understanding concepts of the present invention, example sifter embodiments are described below with reference to logarithmic shifter configurations providing data shifting using 3 stage architectures with respect to input/output data having bit lengths of 8 bits, it should be appreciated that these are exemplary implementations and are not limiting with respect to the present invention. Embodiments of a reconfigurable segmented scalable shifter may, for example, be implemented using logarithmic shifter configurations, barrel shifter configurations, combinational shifter configurations, or combinations thereof. The 8 bit reconfigurable segmented scalable shifter examples are provided for simplicity, and it is expected that reconfigurable segmented scalable shifters in accordance with embodiments of the invention will be implemented to accommodate significantly larger data inputs (e.g., 384 data inputs for a 5G QC-LDPC decoder implementation). Likewise, although examples of segmentation providing configurations having a small number of segments (e.g. M=1 or M=2) are provided for simplifying the concepts discussed, embodiments of a reconfigurable segmented scalable shifter may accommodate a wide range of segmentation configurations having various segment sizes (e.g., segments ranging from 2 to 384 bits, having segment sizes from 384 to 2 for the above mentioned 5G QC-LDPC decoder implementation).

Figure 5A:
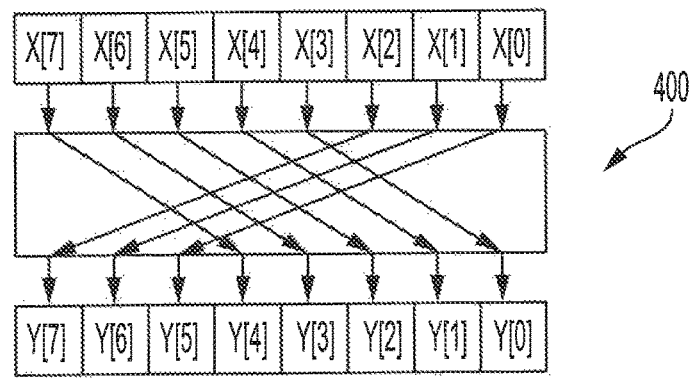
FIG. 5A shows a reconfigurable segmented scalable shifter implementing a single segment providing cyclic data shifting in accordance with embodiments of the invention.

FIG. 5A shows an exemplary embodiment of reconfigurable segmented scalable shifter 400 implemented in a relatively simple configuration helpful for understanding the concepts of the present invention. Reconfigurable segmented scalable shifter 400 of the embodiment of FIG. 5A is configured as an 8 bit single segment implementation providing a 3 bit cyclic shift to the right (e.g., shifter size N=8, number of segments M=1, segment 1 size N_1=8, segment 1 shift value S_1=3, segment 1 shift direction D_1=Right, and segment 1 shift type T_1=Cyclic).

The input data (X) comprises 8 bits in the illustrated example. Accordingly, the input data may be represented as X[7:0], wherein X[7:0]={X[7], X[6], X[5], X[4], X[3], X[2], X[1], X[0]}. Correspondingly, the output data may be represented as Y[7:0], wherein Y[7:0]={Y[7], Y[6], Y[5], Y[4], Y[3], Y[2], Y[1], Y[0]}. As mentioned above, the number of segments (M) is 1 in this example. Accordingly, X_1[7:0]=X[7:0] and Y_1[7:0]=Y[7:0], where X_1[7:0] is the input data of segment 1 and Y_1[7:0] is the output data of segment 1.

Figure 5B:
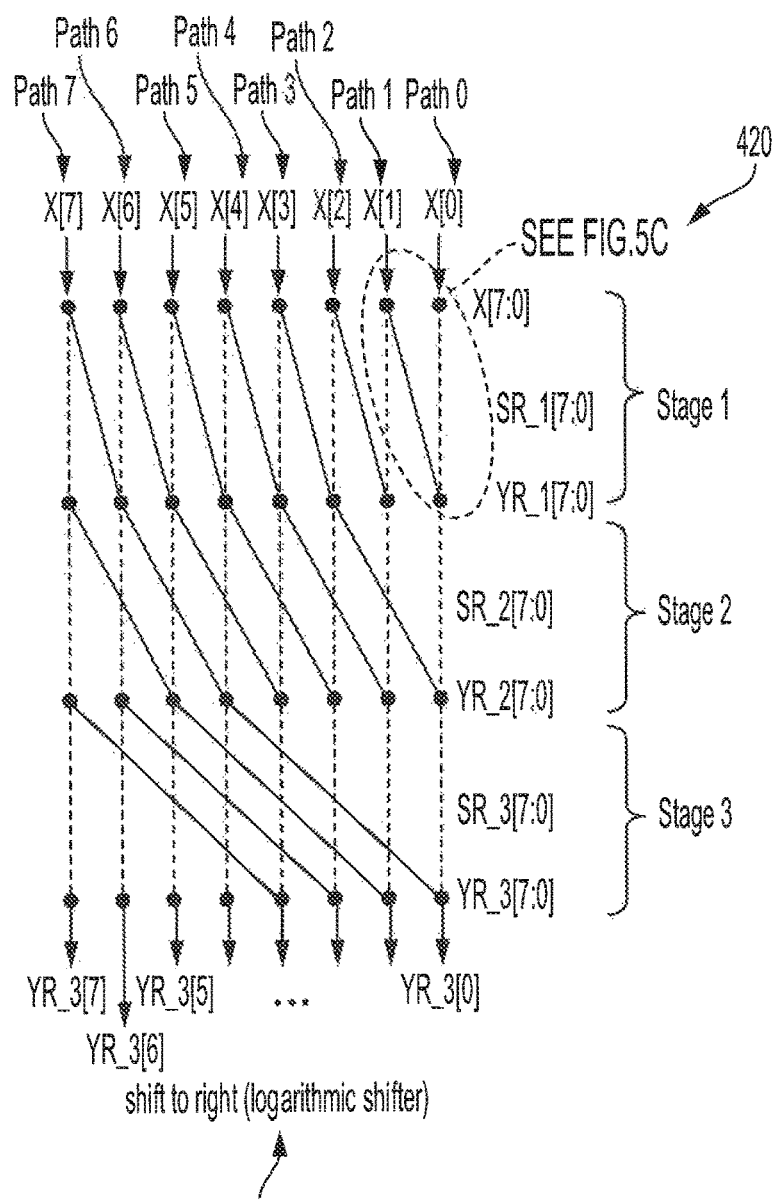
FIGS. 5B-5D show details with respect to a logarithmic shifter configuration of a reconfigurable segmented scalable shifter embodiment of FIG. 5A.
Figure 5C:
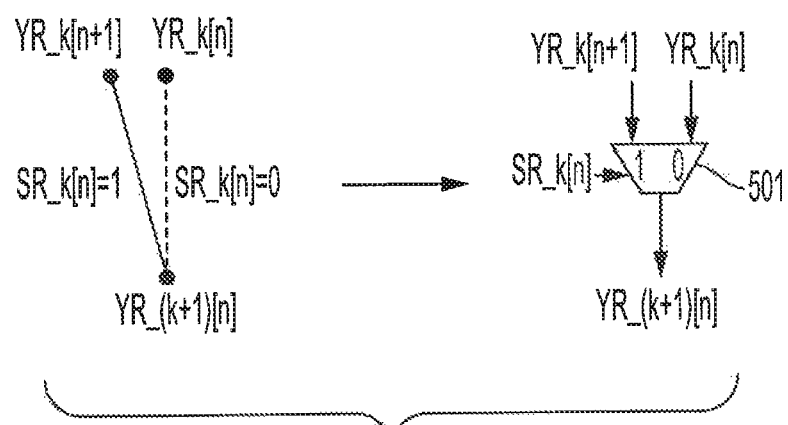
Figure 5D:
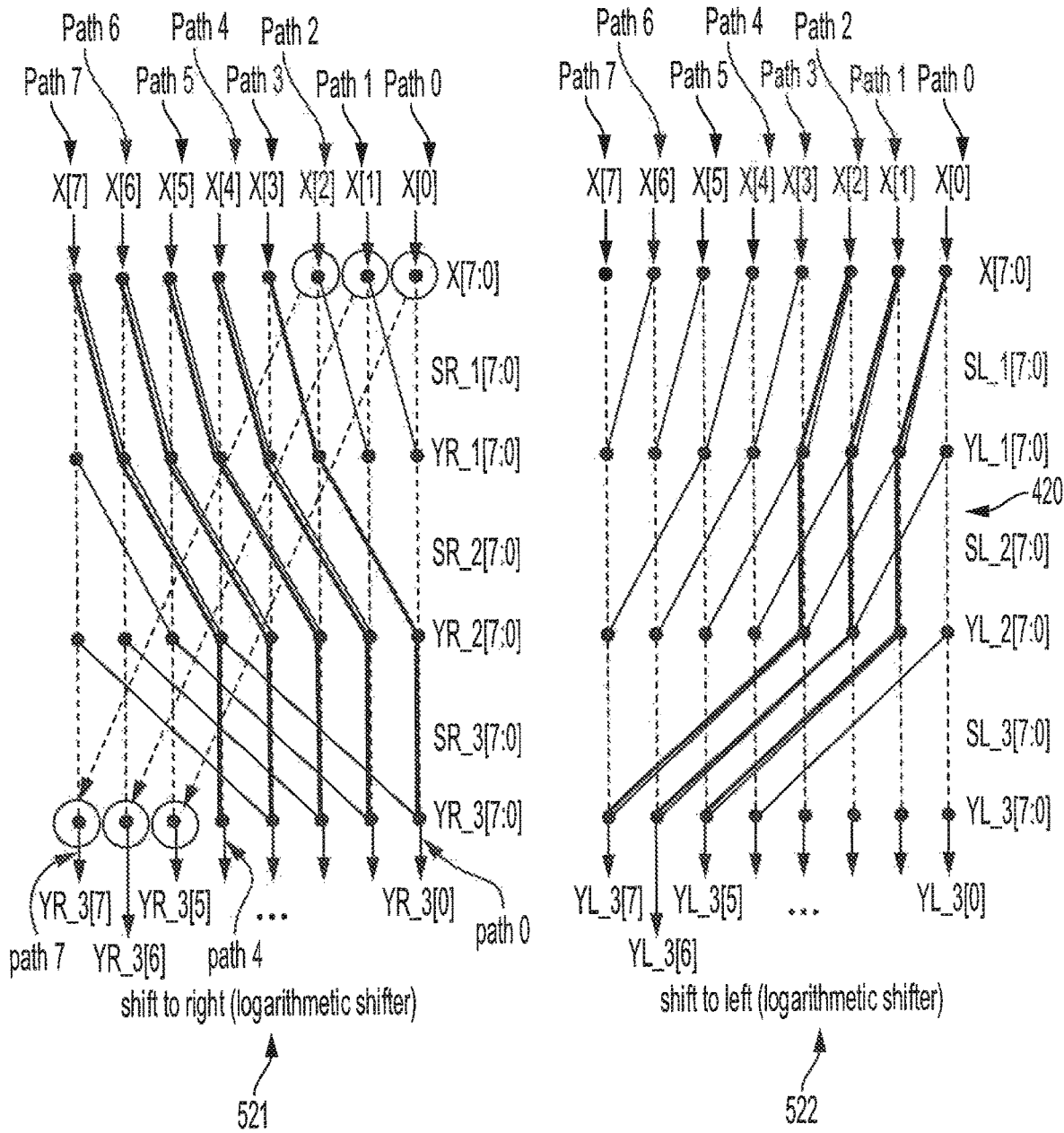

As shown in FIGS. 5B-5D, the reconfigurable segmented scalable shifter of FIG. 5A may be implemented using a logarithmic shifter configuration. The number of stages of the logarithmic shifter is K=ceil[log 2(N)]. In the exemplary embodiment N=8, and thus K=log 2(8)=3. The 3 stages of a logarithmic shifter are shown in the right shift portion of shifter stage 420 shown in FIG. 5B, wherein YR_1[7:0]= output of stage 1, YR_2[7:0]=output of stage 2, and YR_3 [7:0]=output of stage 3.

The stages of the logarithmic shifter implement log increasing shifts at each stage (e.g., shift 1 bit at stage 1, shift 2 bits at stage 2, shift 4 bits at stage 4). The shifts provided by the stages may be controllably combined to provide a range of shift values from 0 (e.g., pass data bits straight through without shifting) through the combined total shift values of all stages (e.g., 1+2+4=7 in the 3 stage example). In the example of the illustrated embodiment, the segment 1 shift value S_1=3 and the segment 1 shift direction D_1=Right. This may be represented as a shift right command for segment 1 of SR1=3, which may be provided in a 3 bit binary coded decimal (BCD) representation as 3'b011. It should be appreciated that the 3 bits of the BCD shift command representation correspond to the operation of the 3 stages in performing the desired data shift. In particular, in the BCD representation the LSB (1 in this example) corresponds to the shift of stage 1 being selected (stage 1 providing shift right 1 bit), the middle bit (1 in this example) corresponds to the shift of stage 2 being selected (stage 2 providing shift right 2 bits), and the most significant bit (MSB) (0 in this example) corresponds to the shift of stage 3 not being selected (stage 3 passing data bits straight through without providing shift right 4 bits) to thereby provide 3 bit right shift.

Control signals may be provided with respect to each stage of the shifter to implement the foregoing commands with respect to any instance of data shifting. For example, as shown in FIG. 5C, a data shift for any particular bit at the various stages of the shifter may be implemented using a multiplexer architecture. In particular, an instance of multiplexer 501 may be disposed at the path junctions of each stage (e.g., junctions of path 0 and path 1, path 1 and path 2, path 2 and path 3, path 3 and path 4, path 4 and path 5, path 5 and path 6, and path 6 and path 7 in stage 1, junctions of path 0 and path 2, path 1 and path 3, path 2 and path 4, path 3 and path 5, path 4 and path 6, and path 5 and path 7 in stage 2, junctions of path 0 and path 4, path 1 and path 5, path 2 and path 6, and path 3 and path 7 in stage 3 of right shift portion 521 (FIG. 5D) and junctions of path 1 and path 0, path 2 and path 1, path 3 and path 2, path 4 and path 3, path 5 and path 4, path 6 and path 5, and path 7 and path 6 in stage 1, junctions of path 2 and path 0, path 3 and path 1, path 4 and path 2, path 5 and path 3, path 6 and path 4, and path 7 and path 5 in stage 2, junctions of path 4 and path 0, and path 5 and path 1, path 6 and path 2, path 7 and path 3 in stage 3 of left shift portion 522) and provided with a control signal to select output of either shifted data or passing data straight through.

As illustrated in FIG. 5C, embodiments in accordance with the foregoing provide SR_k[n] as the control signal of stage k, path n. Accordingly, SR_1[7:0]=control signals for the paths of right shift stage 1, SR_2[7:0]=control signals for the paths of right shift stage 2, and SR_3[7:0]=control signals for the paths of right shift stage 3 in the 3 stages of the right shift portion of shifter stage 420 shown in FIG. 5B. If the control signal of a path is "0", the data will propagate along the same path to next stage. However, if the control signal of the path is "1", the data of the other path coupled to the multiplexer will propagate along that path to the next stage. Accordingly, in the above described example where SR_1=3=3'b011, the control signals for the stages of the shifter may be represented as SR_1[7:0]=1111_1111 (stage 1), SR_2[7:0]=1111_1111 (stage 2), and SR_3[7:0]= 0000_0000 (stage 3). Implementing the data shifts in accordance with these control signals to provide 3 bit right shift of X[3] to Y[0], X[4] to Y[1], X[5] to Y[2], X[6] to Y[3], and X[7] to Y[4] is illustrated in the bolded paths of right shift portion 521 shown in FIG. 5D.

As previously mentioned, segmented scalable shifter 400 of FIG. 5A is configured as an 8 bit single segment implementation providing a 3 bit cyclic shift to the right. The right shift portion of shifter stage 420 shown in FIG. 5B, however, does not provide paths for implementing the cyclic aspect of the data shift (e.g., to route data from X[2] to Y[7], from X[1] to Y[6], and from X[0] to Y[5]. Accordingly, embodiments implement another shifter portion in shifter stage 420 for this purpose.

FIG. 5D shows right shift portion 521 and left shift portion 522 of shifter stage 420. In accordance with embodiments of the invention, in a right cyclic shift operation, right shift portion 521 may provide right data shifts and left shift portion 522 may be utilized for implementing the cyclic aspect of the data shift. Similarly, in a left cyclic shift operation, left shift portion 522 may provide left data shifts and right shift portion 521 may be utilized for implementing the cyclic aspect of the data shift. Moreover, as will be better understood from the discussion which follows, right shift portion 521 may provide right shifts in right arithmetic shift and right logical shift operations. Similarly, left shift portion 522 may provide left shifts in left arithmetic shift and left logical shift operations.

Continuing with the 3 bit cyclic shift to the right of the example, right shift portion 521 provides the 3 bit shift to the right to appropriately route data from X[3] to Y[0], from X[4] to Y[1], from X[5] to Y[2], from X[6] to Y[3], and from X[7] to Y[4], as shown in FIG. 5D. However, right shift portion 521 does not appropriately route data from X[2] to Y[7], from X[1] to Y[6], and from X[0] to Y[5] for the 3 bit cyclic shift to the right. This cyclic aspect of the data shift may be implemented as a left shift of the particular input data. The left shift needed for the particular right cyclic shift being implemented may be computed from the segment size and segment shift value (e.g., shift left command equals segment size minus right shift value). In the above example, SL_1=N_1−S_1=8-3=5, wherein SL is the segment 1 shift left command, N_1 is the segment 1 segment size, and S_1 is the segment 1 shift value. This may be represented as a shift left command for segment 1 of SL1=5, which may be provided in a 3 bit BCD representation as 3′b101.

Similar to the control signals provided with respect to the right shift portion, embodiments in accordance with the foregoing provide SL_k[n] as the control signal of stage k, path n. Accordingly, SL_[7:0]=control signals for the paths of left shift stage 1, SL_2[7:0]=control signals for the paths of left shift stage 2, and SL_3[7:0]=control signals for the paths of left shift stage 3 in the 3 stages of the left shift portion of shifter stage 420 shown in FIG. 5D. Accordingly, in the above described example where SL1=5=3′b101, the control signals for the stages of the shifter may be represented as SL_1[7:0]=1111_1111 (stage 1), SL_2[7:0]= 0000_0000 (stage 2), and SL_3[7:0]=1111_1111 (stage 3). Implementing the data shifts in accordance with these control signals to provide 5 bit left shift of X[2] to Y[7], X[1] to Y[6], and X[0] to Y[5] to implement the cyclic aspect of the 3 bit right cyclic shift is illustrated in the bolded paths of left shift portion 522 shown in FIG. 5D.

It should be understood that both selections (i.e., dashed line for the path of selection value of 0, and solid line for the path of selection value of 1) of the selectable shifter paths are shown in the illustrations of FIGS. 5B and 5D for all outputs of all stages (i.e., YR_3[7:0], YR_2[7:0], YR_1[7:0]) to show the various possible paths that may be selected using the aforementioned control signals. In FIG. 5B, for example, one output of stage 1 YR_1[0] has two sources X[1] and X[0], wherein if the selection value is 0 the source from X[0] will be selected but if the selection value is 1 the source from X[1] will be selected. The bold lines overlaying the illustrated possible selectable paths in FIG. 5D illustrate the finally selected path contributing to the final output of the shifter in the example given above.

Figure 6:
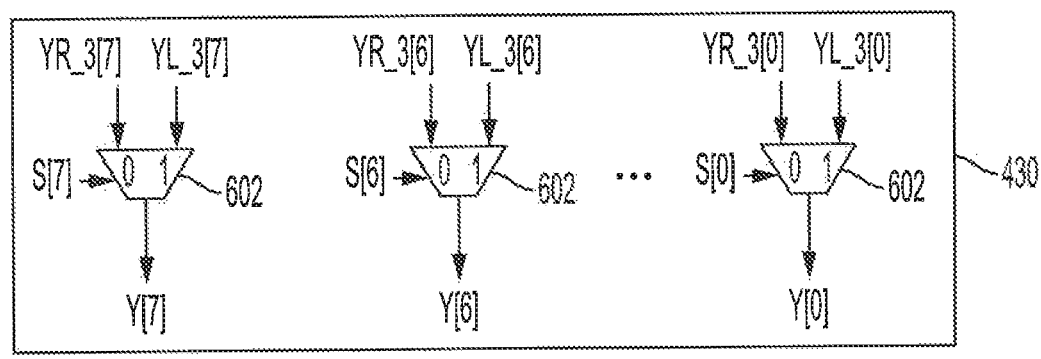
FIG. 6 shows an output stage configured to merge results of a right shifter portion and left shifter portion to provide cyclic shift results according to embodiments of the invention.

Output stage 430 of embodiments operates to merge the results of right shifter portion 521 and left shifter portion 522 to provide the cyclic shift results. For example, output stage 430 may comprise instances of multiplexer 602 disposed at the corresponding outputs of each path of right shift portion 521 and left shift portion 522 (e.g., path 0 of both portions, path 1 of both portions, path 2 of both portions, path 3 of both portions, path 4 of both portions, path 5 of both portions, path 6 of both portions, and path 7 of both portions) and provided with a control signal to select output of either right shifted data or left shifted data, as shown in FIG. 6. The merging of the shifter results may be controlled by an output selection control signal S[i], wherein S[i]=1 for i≥SL1, where i={0, 1, ... 7}, SL1=N_1−S_1. It can be appreciated that the data of Y[7:0] (i.e., Y[7], Y[6], Y[5], Y[4], Y[3], Y[2], Y[1], Y[0]) as stored and/or output by output stage 430 in this example corresponds to the 3 bit cyclic shift to the right illustrated in FIG. 5A.

Although the foregoing example is described with reference to implementing a right data shift, the concepts are readily applicable to a left data shift. For example, the roles of the right shift portion and left shift portion of the reconfigurable segmented scalable shifter exemplary embodiment may be reversed (i.e., switching the right shift portion for the left shift portion and vice versa) in order to implement a left cyclic shift.

As previously mentioned, reconfigurable segmented scalable shifter 400 of the example of FIGS. 5A-5D provides a relatively simple configuration in which only 1 segment (M=1) is provided in order to aid in understanding the concepts of the present invention. In operation according to embodiments of the invention, the data paths within the same segment all share the same control signal value (i.e., the data paths of a segment are controlled to implement the same data shift). Accordingly, in the above example the control signal of all 8 paths within a particular stage are the same (e.g., for right shift stage 1 all control signal values are 1 or SR_1[7:0]=1111_1111, for right shift stage 2 all control signal values are 1 or SR_2[7:0]=1111_1111, for right shift stage 3 all control signal values are 0 or SR_3[7:0]= 0000_0000, for left shift stage 1 all control signal values are 1 or SL_1[7:0]=1111_1111, for left shift stage 2 all control signal values are 0 or SL_2[7:0]=0000_0000, and for left shift stage 3 all control signals are 1 or SL_3[7:0]= 1111_1111). It should be appreciated, however, that the foregoing example reconfigurable segmented scalable shifter provides individual control signals for each path, facilitating independent control for segmentation according to embodiments of the invention. In contrast, only 1 control signal is provided for all paths of a traditional shifter implementation. Accordingly, such traditional shifters are unable to support the segmentation of embodiments of the present invention.

Figure 7:
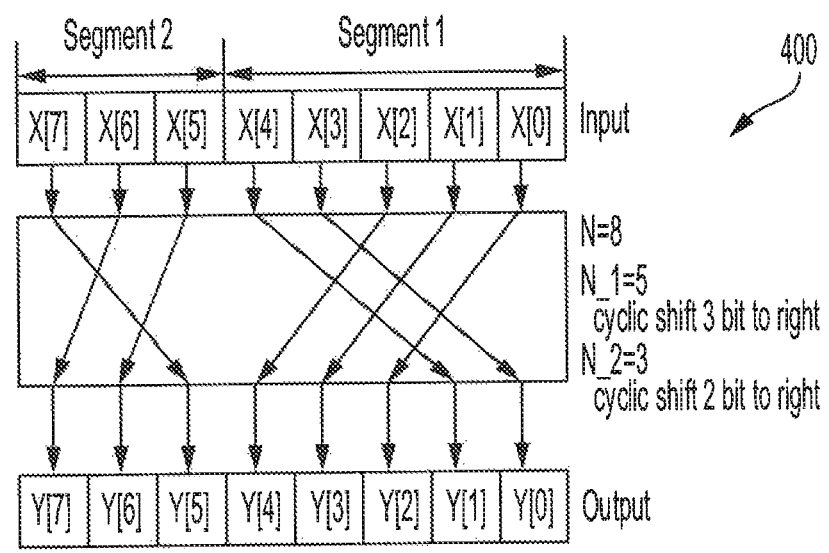
FIG. 7 shows a reconfigurable segmented scalable shifter implementing two segments providing cyclic data shifting in accordance with embodiments of the invention.

To better illustrate the segmentation facilitated by embodiments of a reconfigurable segmented scalable shifter of the present invention, attention is directed to reconfigurable segmented scalable shifter 400 of FIG. 7 implemented in a 2 segment (M=2) configuration. In particular, FIG. 7 shows reconfigurable segmented scalable shifter 400 configured as an 8 bit 2 segment implementation wherein segment 1 provides a 3 bit cyclic shift to the right and segment 2 provides a 2 bit cyclic shift to the right (e.g., shifter size N=8, number of segments M=2, segment 1 size N_1=5, segment 1 shift value S_1=3, segment 1 shift direction D_1=Right, and segment 1 shift type T_1=Cyclic, segment 2 size N_2=3, segment 2 shift value S_2=2, segment 2 shift direction D_2=Right, and segment 2 shift type T_2=Cyclic).

It should be appreciated that, although the example of FIG. 7 shows a configuration in which both segments implement a same type of shift (e.g., cyclic) and a shift in the same direction (e.g., right), there is no limitation with respect to such a configuration according to embodiments of the invention. For example, a reconfigurable segmented scalable shifter of embodiments may be configured to provide different sizes of segments, different shift directions by the segments, different shift values by the segments, and/or different types of shifts by the segments.

As with the example of FIG. 5A, the input data (X) of the example of FIG. 7 comprises 8 bits, wherein the input data may be represented as X[7:0] (e.g., X[7:0]={X[7], X[6], X[5], X[4], X[3], X[2], X[1], X[0]}) and the output data may be represented as Y[7:0] (e.g., Y[7:0]={Y[7], Y[6], Y[5], Y[4], Y[3], Y[2], Y[1], Y[0]}). In the example of FIG. 7, however, the number of segments (M) is 2, wherein segment 1 comprises 5 bits and segment 2 comprises 3 bits such that X_1[4:0] is the input of segment 1 and X_2[2:0] is the input of segment 2, and Y_1[4:0] is the output data of segment 1 and Y_2[2:0] is the output data of segment 2. Accordingly, X[7:0]={X[7], X[6], X[5], X[4], X[3], X[2], X[1], X[0]}={X_2[2:0], X_[4:0]}, wherein X_1[4:0]={X[4], X[3], X[2], X[1], X[0]} and X_2[2:0]=(X[7], X[6], X[5]}. Similarly, Y[7:0]={Y[7], Y[6], Y[5], Y[4], Y[3], Y[2], Y[1], Y[0]}= ({Y_2[2:0], Y_1[4:0]}, wherein Y_1[4:0]={Y[4], Y[3], Y[2], Y[1], Y[0]}, and Y_2[2:0]={Y[7], Y[6], Y[5]}.

Figure 8:
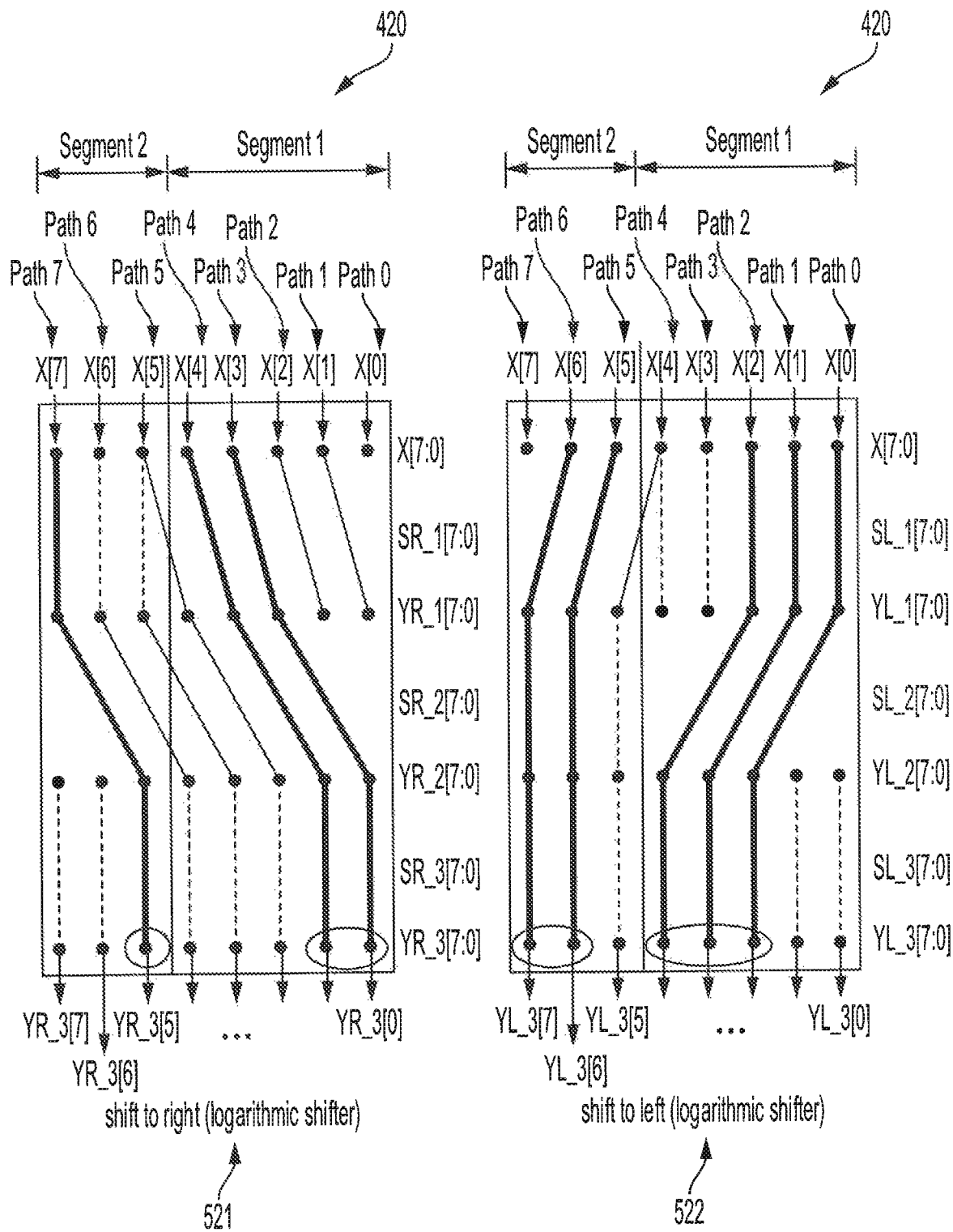
FIG. 8 shows an example of a shifter stage to a logarithmic shifter configuration according to embodiments of the invention.

FIG. 8 shows an example of a shifter stage, as may be utilized in an embodiment of the reconfigurable segmented scalable shifter of FIG. 7, implemented using a logarithmic shifter configuration. The number of stages of the logarithmic shifter is K=ceil[log 2(N)], wherein in the exemplary embodiment N=8, and thus K=log 2(8)=3, as discussed above. The 3 stages of a logarithmic shifter are shown in right shift portion 521 and left shift portion 522 of shifter stage 420 illustrated in FIG. 8, wherein YR_1[7:0]=output of stage 1 of the right shift portion, YR_2[7:0]=output of stage 2 of the right shift portion, YR_3[7:0]=output of stage 3 of the right shift portion, YL_1[7:0]=output of stage 1 of the left shift portion, YL_2[7:0]=output of stage 2 of the left shift portion, and YL_3[7:0]=output of stage 3 of the left shift portion.

As discussed in detail in the previous example, embodiments of reconfigurable segmented scalable shifters may provide SR_k[n] as the control signal of stage k, path n. Accordingly, SR_1[7:0]=control signals for the paths of right shift stage 1, SR_2[7:0]=control signals for the paths of right shift stage 2, and SR_3[7:0]=control signals for the paths of right shift stage 3 in the 3 stages of the right shift portion of shifter stage 420 shown in FIG. 8. Correspondingly, SL_1[7:0]=control signals for the paths of left shift stage 1, SL_2[7:0]=control signals for the paths of left shift stage 2, and SL_3[7:0]=control signals for the paths of left shift stage 3 in the 3 stages of the left shift portion of shifter stage 420 shown in FIG. 8. If the control signal of a path is "0", the data will propagate along the same path to next stage. However, if the control signal of the path is "1", the data of the other path coupled to the multiplexer will propagate along that path to the next stage.

In this segmented example, SR1=3=3'b011 (i.e., segment 1 shift value S_1=3 and segment 1 shift direction D_1=Right) and SR2=2=3'b010 (i.e., segment 2 shift value S_2=2, segment 2 shift direction D_2=Right). This segmented example provides cyclic shifts, and thus left data shifting is utilized to provide the cyclic aspect of the data shift. In this example, SL1=5−3=2=3'b010 (i.e., segment 1 size N_1=5, segment 1 shift value S_1=3, and segment 1 shift type T_1=Cyclic) and SL2=3−2=1=3'b001 (i.e., segment 2 size N_2=3, segment 2 shift value S_2=2, and segment 2 shift type T_2=Cyclic). The control signals for the stages of the segmented shifter may be represented as SR_1[7:0]=0001_1111 (stage 1), SR_2[7:0]=1111_1111 (stage 2), and SR_3[7:0]=0000_0000 (stage 3) for the right shift portion and SL_1[7:0]=1110_0000 (stage 1), SL_2[7: 0]=0001_1111 (stage 2), and SL_3[7:0]=0000_0000 (stage 3) for the left shift portion. It can be appreciated that segmented data shifting is provided for the 5 bits of segment 1 by the right most 5 bits of each of the foregoing control signals, and for the 3 bits of segment 2 by the left most 3 bits of each of the foregoing control signals. Implementing the data shifts in accordance with the shift right control signals (SR_1, SR_2, and SR_3) provides 3 bit right shift of X[3] to Y[0] and X[4] to Y[1] for segment 1 and 2 bit right shift of X[7] to Y[5] for segment 2 as illustrated by the bolded paths of right shift portion 521 of FIG. 8. Correspondingly, implementing the data shifts in accordance with the shift left control signals (SL_1, SL_2, and SL_3) provides 2 bit left shift of X[0] to Y[2], X[1] to Y[3] and X[2] to Y[4] for the cyclic aspect of segment 1 and 1 bit left shift of X[5] to Y[6] and X[6] to Y[7] for the cyclic aspect of segment 2 as illustrated by the bolded paths of right shift portion 521 of FIG. 8.

In the illustration of FIG. 8, the un-selected paths of the selectable shifter paths are not shown, and that only the selected path for each output of each stage are shown, wherein the bold lines illustrate the finally selected path contributing to the final output of the shifter in the example given above. It should be appreciated that the illustration of FIG. 8, having the un-selected paths not shown, is in contrast to the illustration in FIG. 5D where both selections (i.e., dashed line for the path of selection value of 0, and solid line for the path of selection value of 1) of the selectable shift paths are shown with the finally selected path contributing to the final output of the shifter.

As previously described, output stage 430 of embodiments operates to merge the results of right shifter portion 521 and left shifter portion 522 to provide the cyclic shift results, such as through the use of instances of multiplexer 602 as shown in FIG. 6. The merging of the shifter results in this segmented example may be controlled by an output selection control signal S[i], wherein: S[i]=1 for i≥SL1, where i={0, 1, . . . 4}, SL1=N_1−S_1 (segment 1) and S[i]=1 for i≥SL2+5, where i=(5, 6, 7), SL2=N_2−S_2 (segment 2). It can be appreciated that the data of Y[7:0] (i.e., Y[7], Y[6], Y[5], Y[4], Y[3], Y[2], Y[1], Y[0]) as stored and/or output by output stage 430 in this example corresponds to the 3 bit cyclic shift to the right of segment 1 and the 2 bit cyclic shift to the right of segment 2 illustrated in FIG. 7.

Although the above example is described with reference to implementing a right data shift, the concepts are readily applicable to a left data shift. For example, the roles of the right shift portion and left shift portion of the reconfigurable segmented scalable shifter exemplary embodiment may be reversed (i.e., switching the right shift portion for the left shift portion and vice versa) in order to implement a left cyclic shift.

Figure 11:
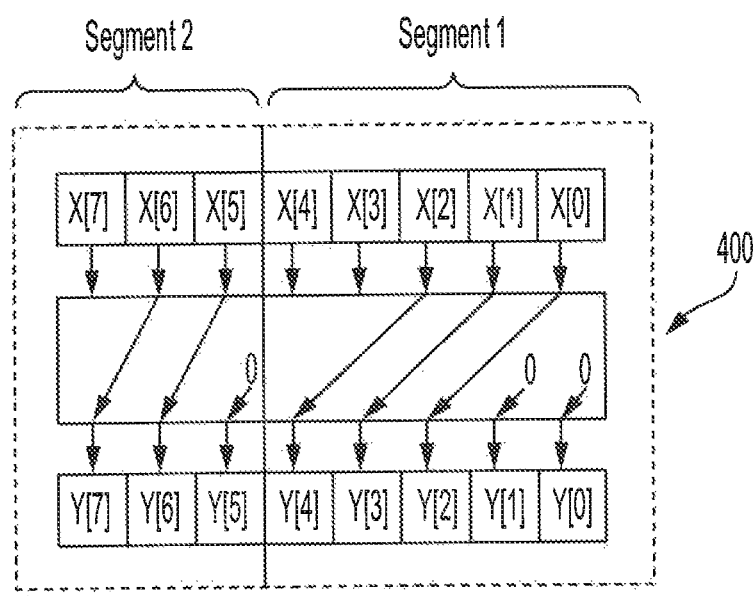
FIG. 11 shows a reconfigurable segmented scalable shifter implementing two segments providing left arithmetic data shifting in accordance with embodiments of the invention.
Figure 13:
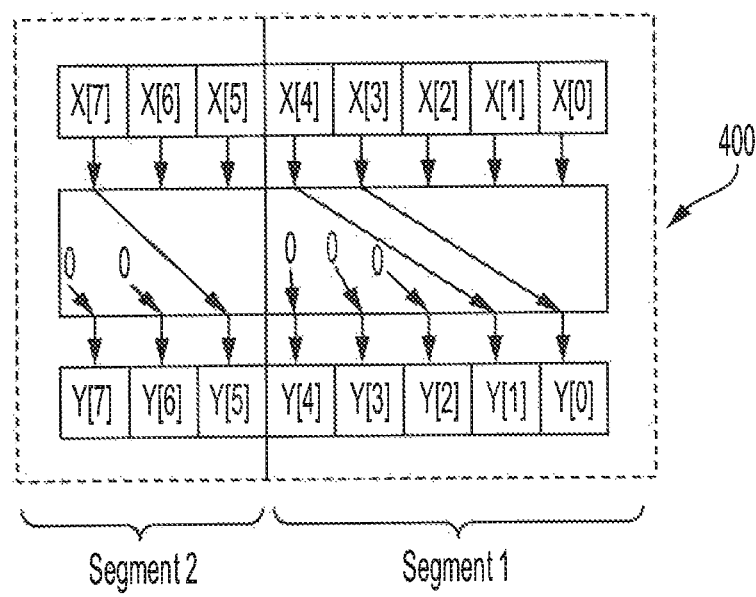
FIG. 13 shows a reconfigurable segmented scalable shifter implementing two segments providing right logical data shifting in accordance with embodiments of the invention.
Figure 15:
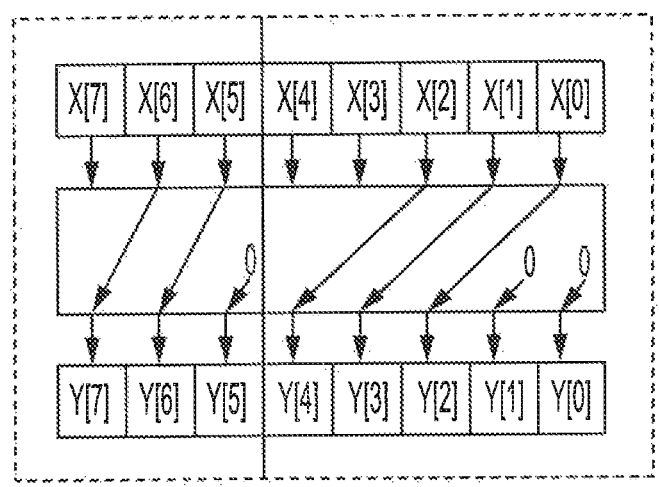
FIG. 15 shows a reconfigurable segmented scalable shifter implementing two segments providing left logical data shifting in accordance with embodiments of the invention.

Further, although the two examples above are described with reference to implementing cyclic shifts, the concepts are readily applicable to other types of data shifting. For example, arithmetic shifts and/or logical shifts may be implemented using the exemplary reconfigurable segmented scalable shifter architecture. Accordingly, FIGS. 9 and 11 show examples of implementing arithmetic shifts using the exemplary reconfigurable segmented scalable shifter architecture and FIGS. 13 and 15 show examples of implementing logical shifts using the exemplary reconfigurable segmented scalable shifter architecture.

Figure 9:
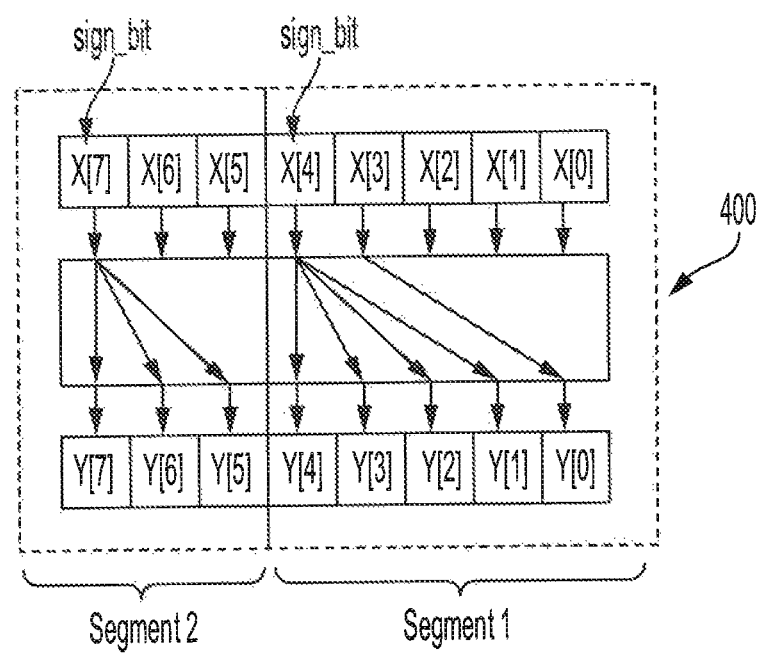
FIG. 9 shows a reconfigurable segmented scalable shifter implementing two segments providing right arithmetic data shifting in accordance with embodiments of the invention.

Referring first to FIG. 9, an example of segmented arithmetic data shifting is shown. In particular, FIG. 9 shows reconfigurable segmented scalable shifter 400 configured as an 8 bit 2 segment implementation wherein segment 1 provides a 3 bit arithmetic shift to the right and segment 2 provides a 2 bit arithmetic shift to the right (e.g., shifter size N=8, number of segments M=2, segment 1 size N_1=5, segment 1 shift value S_1=3, segment 1 shift direction D_1=Right, and segment 1 shift type T_1=Arithmetic, segment 2 size N_2=3, segment 2 shift value S_2=2, segment 2 shift direction D_2=Right, and segment 2 shift type T_2=Arithmetic). It should be appreciated that, although the example of FIG. 9 shows a configuration in which both segments implement a same type of shift (e.g., arithmetic) and a shift in the same direction (e.g., right), there is no limitation with respect to such a configuration according to embodiments of the invention.

As with the previous examples, the input data (X) of the example of FIG. 9 comprises 8 bits, wherein the input data may be represented as X[7:0] (e.g., X[7:0]={X[7], X[6], X[5], X[4], X[3], X[2], X[1], X[0]}) and the output data may be represented as Y[7:0] (e.g., Y[7:0]={Y[7], Y[6], Y[5], Y[4], Y[3], Y[2], Y[1], Y[0]}). In the example of FIG. 9, the number of segments (M) is 2, wherein segment 1 comprises 5 bits and segment 2 comprises 3 bits such that X_1[4:0] is the input of segment 1 and X_2[2:0] is the input of segment 2, and Y_1[4:0] is the output data of segment 1 and Y_2[2:0] is the output data of segment 2. Accordingly, X[7:0]={X[7], X[6], X[5], X[4], X[3], X[2], X[1], X[0]}={X_2[2:0], X_1[4:0]}, wherein X_1[4:0]={X[4], X[3], X[2], X[1], X[0]} and X_2[2:0]={X[7], X[6], X[5]}. Similarly, Y[7:0]={Y[7], Y[6], Y[5], Y[4], Y[3], Y[2], Y[1], Y[0]}={Y_2[2:0], Y_1[4:0]}, wherein Y_1[4:0]={Y[4], Y[3], Y[2], Y[1], Y[0]}, and Y_2[2:0]={Y[7], Y[6], Y[5]}.

FIG. 8 shows an example of a shifter stage, as may be utilized in an embodiment of the reconfigurable segmented scalable shifter of FIG. 9, implemented using a logarithmic shifter configuration. The number of stages of the logarithmic shifter is K=ceil[log 2(N)], wherein in the exemplary embodiment N=8, and thus K=log 2(8)=3, as discussed above. The 3 stages of a logarithmic shifter are shown in right shift portion 521 of shifter stage 420 illustrated in FIG. 8, wherein YR_1[7:0]=output of stage 1 of the right shift portion, YR_2[7:0]=output of stage 2 of the right shift portion, and YR_3[7:0]=output of stage 3 of the right shift portion. It should be noted that left shift portion 522 of shifter stage 420 shown in FIG. 8 is not utilized in the example of FIG. 9 in light of the functionality of the left shift portion not being needed to implement the right arithmetic shift.

As previously discussed, embodiments of reconfigurable segmented scalable shifters may provide SR_k[n] as the right shift portion control signal of stage k, path n. Accordingly, SR_1[7:0]=control signals for the paths of right shift stage 1, SR_2[7:0]=control signals for the paths of right shift stage 2, and SR_3[7:0]=control signals for the paths of right shift stage 3 in the 3 stages of the right shift portion of shifter stage 420 shown in FIG. 8. If the control signal of a path is "0", the data will propagate along the same path to next stage. However, if the control signal of the path is "1", the data of the other path coupled to the multiplexer will propagate along that path to the next stage. The left shift portion control signal SL_k[n] is unneeded in this example and may be any value (i.e., "don't care").

In this segmented example, SR1=3=3'b011 (i.e., segment 1 shift value S_1=3 and segment 1 shift direction D_1=Right) and SR2=2=3'b010 (i.e., segment 2 shift value S_2=2, segment 2 shift direction D_2=Right). The control signals for the stages of the segmented shifter may be represented as SR_1[7:0]=0001_1111 (stage 1), SR_2[7:0]= 1111_1111 (stage 2), and SR_3[7:0]=0000_0000 (stage 3) for the right shift portion. It can be appreciated that segmented data shifting is provided for the 5 bits of segment 1 by the right most 5 bits of each of the foregoing control signals, and for the 3 bits of segment 2 by the left most 3 bits of the foregoing control signals. Implementing the data shifts in accordance with the shift right control signals (SR_1, SR_2, and SR_3) provides 3 bit right shift of X[3] to Y[0] and X[4] to Y[1] for segment 1 and 2 bit right shift of X[7] to Y[5] for segment 2 as illustrated by the bolded paths of right shift portion 521 of FIG. 8.

Figure 10:
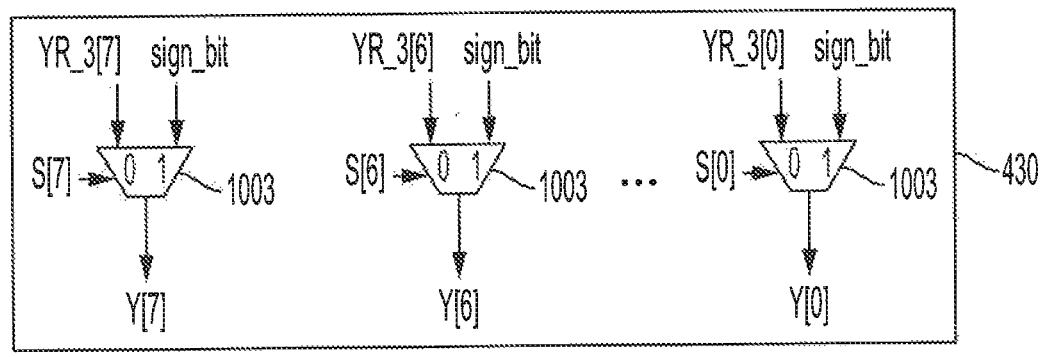
FIG. 10 shows an output stage configured to replace shifter results with sign bits to provide arithmetic shift results according to embodiments of the invention.

The segmented reconfigurable segmented scalable shifter configuration of this example provides arithmetic shifts and thus, although the bits actually shifted (e.g., the outputs of path 0 and path 1 for segment 1 and path 5 for segment 2, as shown by the circled stage 3 outputs in right shift portion 521 of FIG. 8), a sign bit (e.g., sign-bit X[7] for segment 2 and sign bit X[4] for segment 1) is inserted as the leftmost bit for each right shift operation (e.g., the outputs of path 2, path 3, and path 4 for segment 1 and path 6 and path 7 for segment 2, as shown by the circled stage 3 outputs in left shift portion 522 of FIG. 8). The data output positions tied to a respective sign bit X[N] may be determined according to YL_K[N−1:0], wherein the data bit for YL_K is replaced with the respective sign bit, rather than the output of the left shift portion as in the previous cyclic shift examples, for merging with the output of the right shift portion. Accordingly, output stage 430 of embodiments operates to merge the results of right shifter portion 521 and the sign bit for respective segments to provide the arithmetic shift results, such as through the use of instances of multiplexer 1003 as shown in FIG. 10. The merging of the shifter results and sign bits in this segmented example may be controlled by an output selection control signal S[i], wherein: S[i]=1 for i≥SL1, i={0, 1, . . . 4}, SL1=N_1−S_1 (segment 1) and S[i]=1 for i≥SL2+5, i={5, 6, 7}, SL2=N_2−S_2 (segment 2). It can be appreciated that the data of Y[7:0] (i.e., Y[7], Y[6], Y[5], Y[4], Y[3], Y[2], Y[1], Y[0]) as stored and/or output by output stage 430 in this example corresponds to the 3 bit arithmetic shift to the right of segment 1 and the 2 bit arithmetic shift to the right of segment 2 illustrated in FIG. 9.

Referring now to FIG. 11, another example of segmented arithmetic data shifting is shown. In particular, FIG. 11 shows reconfigurable segmented scalable shifter 400 configured as an 8 bit 2 segment implementation wherein segment 1 provides a 2 bit arithmetic shift to the left and segment 2 provides a 1 bit arithmetic shift to the left (e.g., shifter size N=8, number of segments M=2, segment 1 size N_1=5, segment 1 shift value S_1=2, segment 1 shift direction D_1=Left, and segment 1 shift type T_1=Arithmetic, segment 2 size N_2=3, segment 2 shift value S_2=1, segment 2 shift direction D_2=Left, and segment 2 shift type T_2=Arithmetic). It should be appreciated that, although the example of FIG. 11 shows a configuration in which both segments implement a same type of shift (e.g., arithmetic) and a shift in the same direction (e.g., left), there is no limitation with respect to such a configuration according to embodiments of the invention.

As with the previous examples, the input data (X) of the example of FIG. 11 comprises 8 bits, wherein the input data may be represented as X[7:0] (e.g., X[7:0]=({X[7], X[6], X[5], X[4], X[3], X[2], X[1], X[0]}) and the output data may be represented as Y[7:0] (e.g., Y[7:0]={Y[7], Y[6], Y[5], Y[4], Y[3], Y[2], Y[1], Y[0]}). In the example of FIG. 11, the number of segments (M) is 2, wherein segment 1 comprises 5 bits and segment 2 comprises 3 bits such that X_1[4:0] is the input of segment 1 and X_2[2:0] is the input of segment 2, and Y_1[4:0] is the output data of segment 1 and Y_2[2:0] is the output data of segment 2. Accordingly, X[7:0]={X[7], X[6], X[5], X[4], X[3], X[2], X[1], X[0]}= {X_2[2:0], X_1[4:0]}, wherein X_1[4:0]={X[4], X[3], X[2], X[1], X[0]} and X_2[2:0]={X[7], X[6], X[5]}. Similarly, Y[7:0]={Y[7], Y[6], Y[5], Y[4], Y[3], Y[2], Y[1], Y[0]}={Y_2[2:0], Y_1[4:0]}, wherein Y_1[4:0]={Y[4], Y[3], Y[2], Y[1], Y[0]}, and Y_2[2:0]={Y[7], Y[6], Y[5]}.

FIG. 8 shows an example of a shifter stage, as may be utilized in an embodiment of the reconfigurable segmented scalable shifter of FIG. 11, implemented using a logarithmic shifter configuration. The number of stages of the logarithmic shifter is K=ceil[log 2(N)], wherein in the exemplary embodiment N=8, and thus K=log 2(8)=3, as discussed above. The 3 stages of a logarithmic shifter are shown in left shift portion 522 of shifter stage 420 illustrated in FIG. 8, wherein YL_1[7:0]=output of stage 1 of the left shift portion, YL_2[7:0]=output of stage 2 of the left shift portion, and YL_3[7:0]=output of stage 3 of the left shift portion. It should be noted that right shift portion 521 of shifter stage 420 shown in FIG. 8 is not utilized in the example of FIG. 11 in light of the functionality of the right shift portion not being needed to implement the left arithmetic shift.

As previously discussed, embodiments of reconfigurable segmented scalable shifters may provide SL_k[n] as the left shift portion control signal of stage k, path n. Accordingly, SL_1[7:0]=control signals for the paths of left shift stage 1, SL_2[7:0]=control signals for the paths of left shift stage 2, and SL_3[7:0]=control signals for the paths of left shift stage 3 in the 3 stages of the left shift portion of shifter stage 420 shown in FIG. 8. If the control signal of a path is "0", the data will propagate along the same path to next stage. However, if the control signal of the path is "1", the data of the other path coupled to the multiplexer will propagate along that path to the next stage. The right shift portion control signal SR_k[n] is unneeded in this example and may be any value (i.e., "don't care").

In this segmented example, SL1=2=3'b010 (i.e., segment 1 shift value S_1=2 and segment 1 shift direction D_1=Left) and SL2=1=3'b001 (i.e., segment 2 shift value S_2=1, segment 2 shift direction D_2=Left). The control signals for the stages of the segmented shifter may be represented as SL_1[7:0]=1110_0000 (stage 1), SL_2[7:0]=0001_1111 (stage 2), and SL_3 [7:0]=0000_0000 (stage 3) for the left shift portion. It can be appreciated that segmented data shifting is provided for the 5 bits of segment 1 by the right most 5 bits of each of the foregoing control signals, and for the 3 bits of segment 2 by the left most 3 bits of the foregoing control signals. Implementing the data shifts in accordance with the shift left control signals (SL_1, SL_2, and SL_3) provides 2 bit left shift of X[0] to Y[2], X[1] to Y[3], and X[2] to Y[4] for segment 1 and 1 bit left shift of X[5] to Y[6] and X[6] to Y[7] for segment 2 as illustrated by the bolded paths of left shift portion 522 of FIG. 8.

Figure 12:
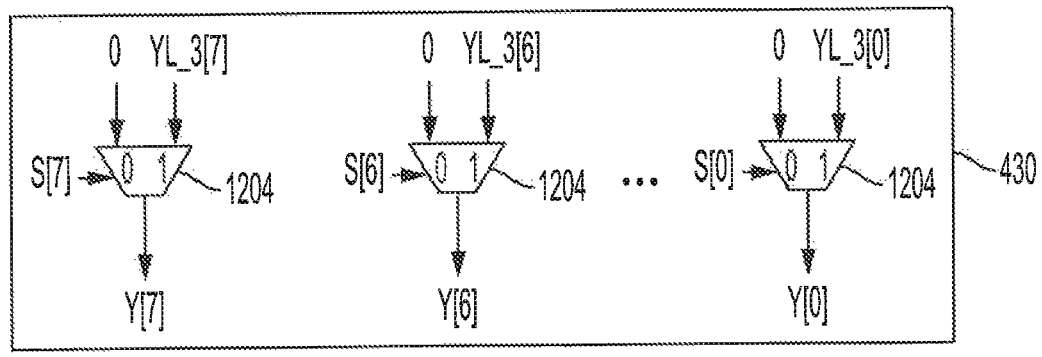
FIG. 12 shows an output stage configured to replace shifter results with 0 to provide arithmetic shift results according to embodiments of the invention.

The segmented reconfigurable segmented scalable shifter configuration of this example provides arithmetic shifts and thus, although the bits actually shifted (e.g., the outputs of path 2, path 3, and path 4 for segment 1 and path 6 and path 7 for segment 2, as shown by the circled stage 3 outputs in left shift portion 522 of FIG. 8), 0 is inserted as the rightmost bit for each left shift operation (e.g., the outputs of path 0 and path 1 for segment 1 and path 5 for segment 2, as shown by the circled stage 3 outputs in right shift portion 521 of FIG. 8). The data output positions tied to 0 may be determined according to YR_K[N−1:0], wherein the data bit for YR_K is replaced with 0, rather than the output of the left shift portion as in the previous cyclic shift examples, for merging with the output of the left shift portion. Accordingly, output stage 430 of embodiments operates to merge the results of left shifter portion 522 and 0 to provide the arithmetic shift results, such as through the use of instances of multiplexer 1204 as shown in FIG. 12. The merging of the shifter results and 0 in this segmented example may be controlled by an output selection control signal S[i], wherein: S[i]=1 for i≥SL1, i={0, 1, . . . 4}, SL1=S_1 (segment 1) and S[i]=1 for i?SL2+5, i=(5, 6, 7), SL2=S_2 (segment 2). It can be appreciated that the data of Y[7:0] (i.e., Y[7], Y[6], Y[5], Y[4], Y[3], Y[2], Y[1], Y[0]) as stored and/or output by output stage 430 in this example corresponds to the 2 bit arithmetic shift to the left of segment 1 and the 1 bit arithmetic shift to the left of segment 2 illustrated in FIG. 11.

Having described examples of cyclic and arithmetic shifters, reference is now made to FIG. 13 for an example implementing a logical shift using the exemplary reconfigurable segmented scalable shifter architecture. In particular, FIG. 13 shows reconfigurable segmented scalable shifter 400 configured as an 8 bit 2 segment implementation wherein segment 1 provides a 3 bit logical shift to the right and segment 2 provides a 2 bit logical shift to the right (e.g., shifter size N=8, number of segments M=2, segment 1 size N_1=5, segment 1 shift value S_1=3, segment 1 shift direction D_1=Right, and segment 1 shift type T_1=Logical, segment 2 sizeN_2=3, segment 2 shift value S_2=2, segment 2 shift direction D_2=Right, and segment 2 shift type T_2=Logical). It should be appreciated that, although the example of FIG. 13 shows a configuration in which both segments implement a same type of shift (e.g., logical) and a shift in the same direction (e.g., right), there is no limitation with respect to such a configuration according to embodiments of the invention.

As with the previous examples, the input data (X) of the example of FIG. 13 comprises 8 bits, wherein the input data may be represented as X[7:0] (e.g., X[7:0]={X[7], X[6], X[5], X[4], X[3], X[2], X[1], X[O]}) and the output data may be represented as Y[7:0] (e.g., Y[7:0]={Y[7], Y[6], Y[5], Y[4], Y[3], Y[2], Y[1], Y[0]}). In the example of FIG. 13, the number of segments (M) is 2, wherein segment 1 comprises 5 bits and segment 2 comprises 3 bits such that X_1[4:0] is the input of segment 1 and X_2[2:0] is the input of segment 2, and Y_1[4:0] is the output data of segment 1 and Y_2[2:0] is the output data of segment 2. Accordingly, X[7:0]={X[7], X[6], X[5], X[4], X[3], X[2], X[1], X[0] }={X_2[2:0], X_1[4:0]}, wherein X_1[4:0]={X[4], X[3], X[2], X[1], X[0]} and X_2[2:0]={X[7], X[6], X[5]}. Similarly, Y[7:0]={Y[7], Y[6], Y[5], Y[4], Y[3], Y[2], Y[1], Y[0]}={Y_2[2:0], Y_1[4:0]}, wherein Y_1[4:0]={Y[4], Y[3], Y[2], Y[1], Y[0]}, and Y_2[2:0]={Y[7], Y[6], Y[5]}.

FIG. 8 shows an example of a shifter stage, as may be utilized in an embodiment of the reconfigurable segmented scalable shifter of FIG. 13, implemented using a logarithmic shifter configuration. The number of stages of the logarithmic shifter is K=ceil[log 2(N)], wherein in the exemplary embodiment N=8, and thus K=log 2(8)=3, as discussed above. The 3 stages of a logarithmic shifter are shown in right shift portion 521 of shifter stage 420 illustrated in FIG. 8, wherein YR_1[7:0]=output of stage 1 of the right shift portion, YR_2[7:0]=output of stage 2 of the right shift portion, and YR_3[7:0]=output of stage 3 of the right shift portion. It should be noted that left shift portion 522 of shifter stage 420 shown in FIG. 8 is not utilized in the example of FIG. 13 in light of the functionality of the left shift portion not being needed to implement the right logical shift.

As previously discussed, embodiments of reconfigurable segmented scalable shifters may provide SR_k[n] as the right shift portion control signal of stage k, path n. Accordingly, SR_1[7:0]=control signals for the paths of right shift stage 1, SR_2[7:0]=control signals for the paths of right shift stage 2, and SR_3[7:0]=control signals for the paths of right shift stage 3 in the 3 stages of the right shift portion of shifter stage 420 shown in FIG. 8. If the control signal of a path is "0", the data will propagate along the same path to next stage. However, if the control signal of the path is "1", the data of the other path coupled to the multiplexer will propagate along that path to the next stage. The left shift portion control signal SL_k[n] is unneeded in this example and may be any value (i.e., "don't care").

In this segmented example, SR1=3=3'b011 (i.e., segment 1 shift value S_1=3 and segment 1 shift direction D_1=Right) and SR2=2=3'b010 (i.e., segment 2 shift value S_2=2, segment 2 shift direction D_2=Right). The control signals for the stages of the segmented shifter may be represented as SR_1[7:0]=0001_1111 (stage 1), SR_2[7:0]=1111_11 (stage 2), and SR_3[7:0]=0000_0000 (stage 3) for the right shift portion. It can be appreciated that segmented data shifting is provided for the 5 bits of segment 1 by the right most 5 bits of each of the foregoing control signals, and for the 3 bits of segment 2 by the left most 3 bits of the foregoing control signals. Implementing the data shifts in accordance with the shift right control signals (SR_1, SR_2, and SR_3) provides 3 bit right shift of X[3] to Y[0] and X[4] to Y[1] for segment 1 and 2 bit right shift of X[7] to Y[5] for segment 2 as illustrated by the bolded paths of right shift portion 521 of FIG. 8.

Figure 14:
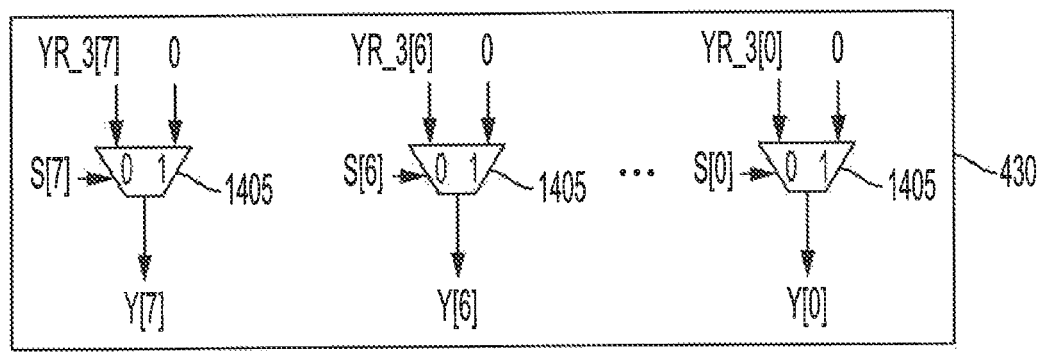
FIG. 14 shows an output stage configured to replace shifter results with 0 to provide logical shift results according to embodiments of the invention.

The segmented reconfigurable segmented scalable shifter configuration of this example provides logical shifts and thus, although the bits actually shifted (e.g., the outputs of path 0 and path 1 for segment 1 and path 5 for segment 2, as shown by the circled stage 3 outputs in right shift portion 521 of FIG. 8), a 0 is inserted as the leftmost bit for each right shift operation (e.g., the outputs of path 2, path 3, and path 4 for segment 1 and path 6 and path 7 for segment 2, as shown by the circled stage 3 outputs in left shift portion 522 of FIG. 8). The data output positions tied to 0 may be determined according to YL_K[N−1:0], wherein the data bit for YL_K is replaced with 0, rather than the output of the left shift portion as in the previous cyclic shift examples, for merging with the output of the right shift portion. Accordingly, output stage 430 of embodiments operates to merge the results of right shifter portion 521 and 0 for respective segments to provide the logical shift results, such as through the use of instances of multiplexer 1405 as shown in FIG. 14. The merging of the shifter results and 0 in this segmented example may be controlled by an output selection control signal S[i], wherein: S[i]=1 for i≥SL1, i={0, 1, . . . 4}, SL1=N_1−S_1 (segment 1) and S[i]=1 for i≥SL2+5, i={5, 6, 7}, SL2=N_2−S_2 (segment 2). It can be appreciated that the data of Y[7:0] (i.e., Y[7], Y[6], Y[5], Y[4], Y[3], Y[2], Y[1], Y[0]) as stored and/or output by output stage 430 in this example corresponds to the 3 bit logical shift to the right of segment 1 and the 2 bit logical shift to the right of segment 2 illustrated in FIG. 13.

Referring now to FIG. 15, another example of segmented logical data shifting is shown. In particular, FIG. 15 shows reconfigurable segmented scalable shifter 400 configured as an 8 bit 2 segment implementation wherein segment 1 provides a 2 bit logical shift to the left and segment 2 provides a 1 bit logical shift to the left (e.g., shifter size N=8, number of segments M=2, segment 1 size N_1=5, segment 1 shift value S_1=2, segment 1 shift direction D_1=Left, and segment 1 shift type T_1=Logical, segment 2 size N_2=3, segment 2 shift value S_2=1, segment 2 shift direction D_2=Left, and segment 2 shift type T_2=Logical). It should be appreciated that, although the example of FIG. 15 shows a configuration in which both segments implement a same type of shift (e.g., logical) and a shift in the same direction (e.g., left), there is no limitation with respect to such a configuration according to embodiments of the invention.

As with the previous examples, the input data (X) of the example of FIG. 15 comprises 8 bits, wherein the input data may be represented as X[7:0] (e.g., X[7:0]={X[7], X[6], X[5], X[4], X[3], X[2], X[1], X[0]}) and the output data may be represented as Y[7:0] (e.g., Y[7:0]={Y[7], Y[6], Y[5], Y[4], Y[3], Y[2], Y[1], Y[0]}). In the example of FIG. 15, the number of segments (M) is 2, wherein segment 1 comprises 5 bits and segment 2 comprises 3 bits such that X_1[4:0] is the input of segment 1 and X_2[2:0] is the input of segment 2, and Y_1[4:0] is the output data of segment 1 and Y_2[2:0] is the output data of segment 2. Accordingly, X[7:0]={X[7], X[6], X[5], X[4], X[3], X[2], X[1], X[0]}={X_2[2:0], X_1[4:0]}, wherein X_1[4:0]=(X[4], X[3], X[2], X[1], X[0]} and X_2[2:0]={X[7], X[6], X[5]}. Similarly, Y[7:0]={Y[7], Y[6], Y[5], Y[4], Y[3], Y[2], Y[1], Y[0]}={Y_2[2:0], Y_1[4:0]}, wherein Y_1[4:0]={Y[4], Y[3], Y[2], Y[1], Y[0]}, and Y_2[2:0]={Y[7], Y[6], Y[5]}.

FIG. 8 shows an example of a shifter stage, as may be utilized in an embodiment of the reconfigurable segmented scalable shifter of FIG. 15, implemented using a logarithmic shifter configuration. The number of stages of the logarithmic shifter is K=ceil[log 2(N)], wherein in the exemplary embodiment N=8, and thus K=log 2(8)=3, as discussed above. The 3 stages of a logarithmic shifter are shown in left shift portion 522 of shifter stage 420 illustrated in FIG. 8, wherein YL_1[7:0]=output of stage 1 of the left shift portion, YL_2[7:0]=output of stage 2 of the left shift portion, and YL_3[7:0]=output of stage 3 of the left shift portion. It should be noted that right shift portion 521 of shifter stage 420 shown in FIG. 8 is not utilized in the example of FIG. 15 in light of the functionality of the right shift portion not being needed to implement the left logical shift.

As previously discussed, embodiments of reconfigurable segmented scalable shifters may provide SL_k[n] as the left shift portion control signal of stage k, path n. Accordingly, SL_1[7:0]=control signals for the paths of left shift stage 1, SL_2[7:0]=control signals for the paths of left shift stage 2, and SL_3[7:0]=control signals for the paths of left shift stage 3 in the 3 stages of the left shift portion of shifter stage 420 shown in FIG. 8. If the control signal of a path is "0", the data will propagate along the same path to next stage. However, if the control signal of the path is "1", the data of the other path coupled to the multiplexer will propagate along that path to the next stage. The right shift portion control signal SR_k[n] is unneeded in this example and may be any value (i.e., "don't care").

In this segmented example, SL1=2=3'b010 (i.e., segment 1 shift value S_1=2 and segment 1 shift direction D_1=Left) and SL2=1=3'b001 (i.e., segment 2 shift value S_2=1, segment 2 shift direction D_2=Left). The control signals for the stages of the segmented shifter may be represented as SL_1[7:0]=1110_0000 (stage 1), SL_2[7:0]=0001_1111 (stage 2), and SL_3[7:0]=0000_0000 (stage 3) for the left shift portion. It can be appreciated that segmented data shifting is provided for the 5 bits of segment 1 by the right most 5 bits of each of the foregoing control signals, and for the 3 bits of segment 2 by the left most 3 bits of the foregoing control signals. Implementing the data shifts in accordance with the shift left control signals (SL_1, SL_2, and SL_3) provides 2 bit left shift of X[0] to Y[2], X[1] to Y[3], and X[2] to Y[4] for segment 1 and 1 bit left shift of X[5] to Y[6] and X[6] to Y[7] for segment 2 as illustrated by the bolded paths of left shift portion 522 of FIG. 8.

The segmented reconfigurable segmented scalable shifter configuration of this example provides logical shifts and thus, although the bits actually shifted (e.g., the outputs of path 2, path 3, and path 4 for segment 1 and path 6 and path 7 for segment 2, as shown by the circled stage 3 outputs in left shift portion 522 of FIG. 8), 0 is inserted as the rightmost bit for each left shift operation (e.g., the outputs of path 0 and path 1 for segment 1 and path 5 for segment 2, as shown by the circled stage 3 outputs in right shift portion 521 of FIG. 8). The data output positions tied to 0 may be determined according to YR_K[N−1:0], wherein the data bit for YR_K is replaced with 0, rather than the output of the left shift portion as in the previous cyclic shift examples, for merging with the output of the left shift portion. Accordingly, output stage 430 of embodiments operates to merge the results of left shifter portion 522 and 0 to provide the arithmetic shift results, such as through the use of instances of multiplexer 1204 as shown in FIG. 12. The merging of the shifter results and 0 in this segmented example may be controlled by an output selection control signal S[i], wherein: S[i]=1 for i≥SL1, i={0, 1, . . . 4}, SL1=S_1 (segment 1) and S[i]=1 for i≥SL2+5, i={5, 6, 7}, SL2=S_2 (segment 2). It can be appreciated that the data of Y[7:0] (i.e., Y[7], Y[6], Y[5], Y[4], Y[3], Y[2], Y[1], Y[0]) as stored and/or output by output stage 430 in this example corresponds to the 2 bit logical shift to the left of segment 1 and the 1 bit logical shift to the left of segment 2 illustrated in FIG. 15.

Figure 16:
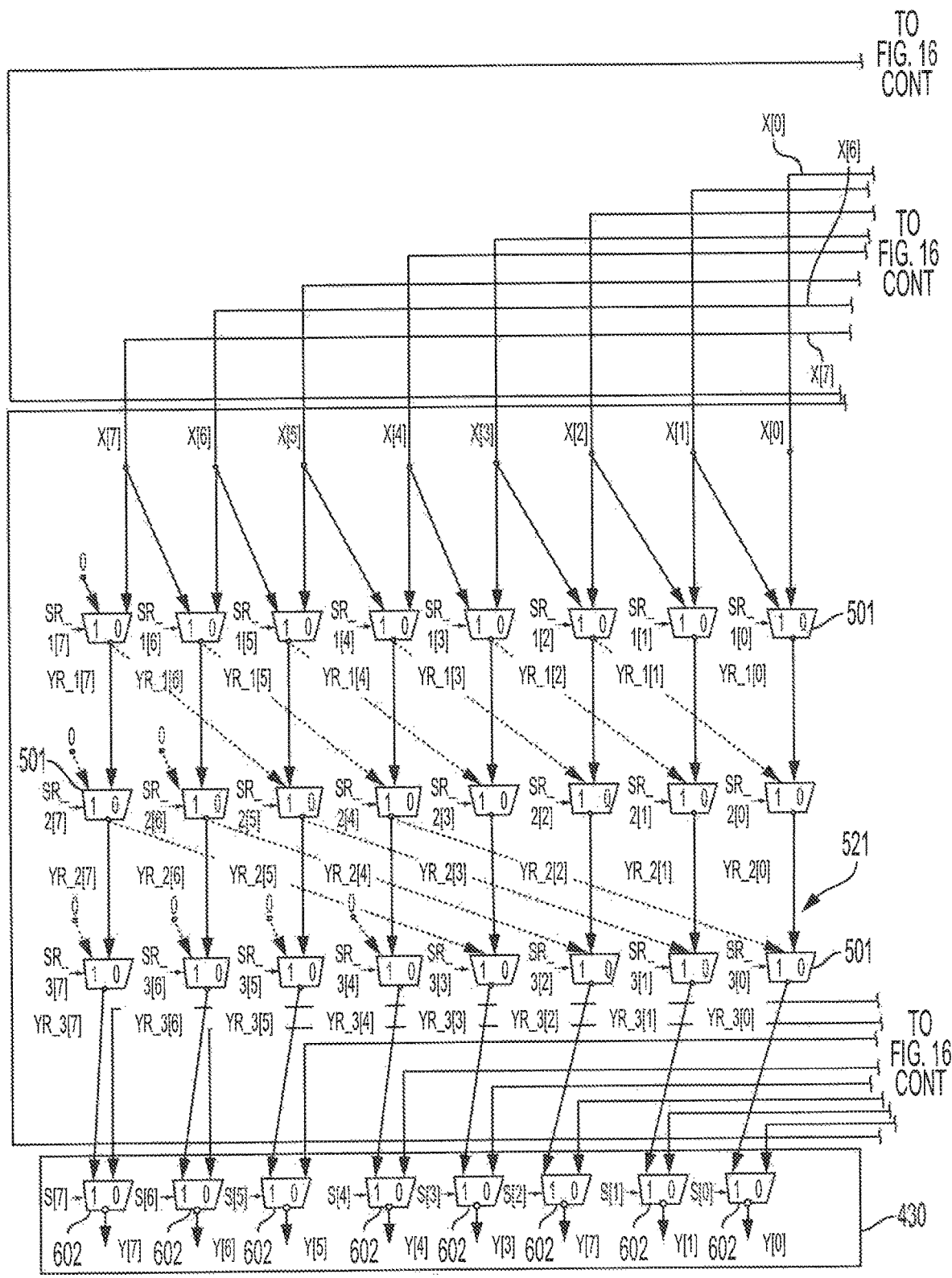
FIG. 16 shows details of a reconfigurable segmented scalable shifter according to embodiments of the invention.
Figure 16:
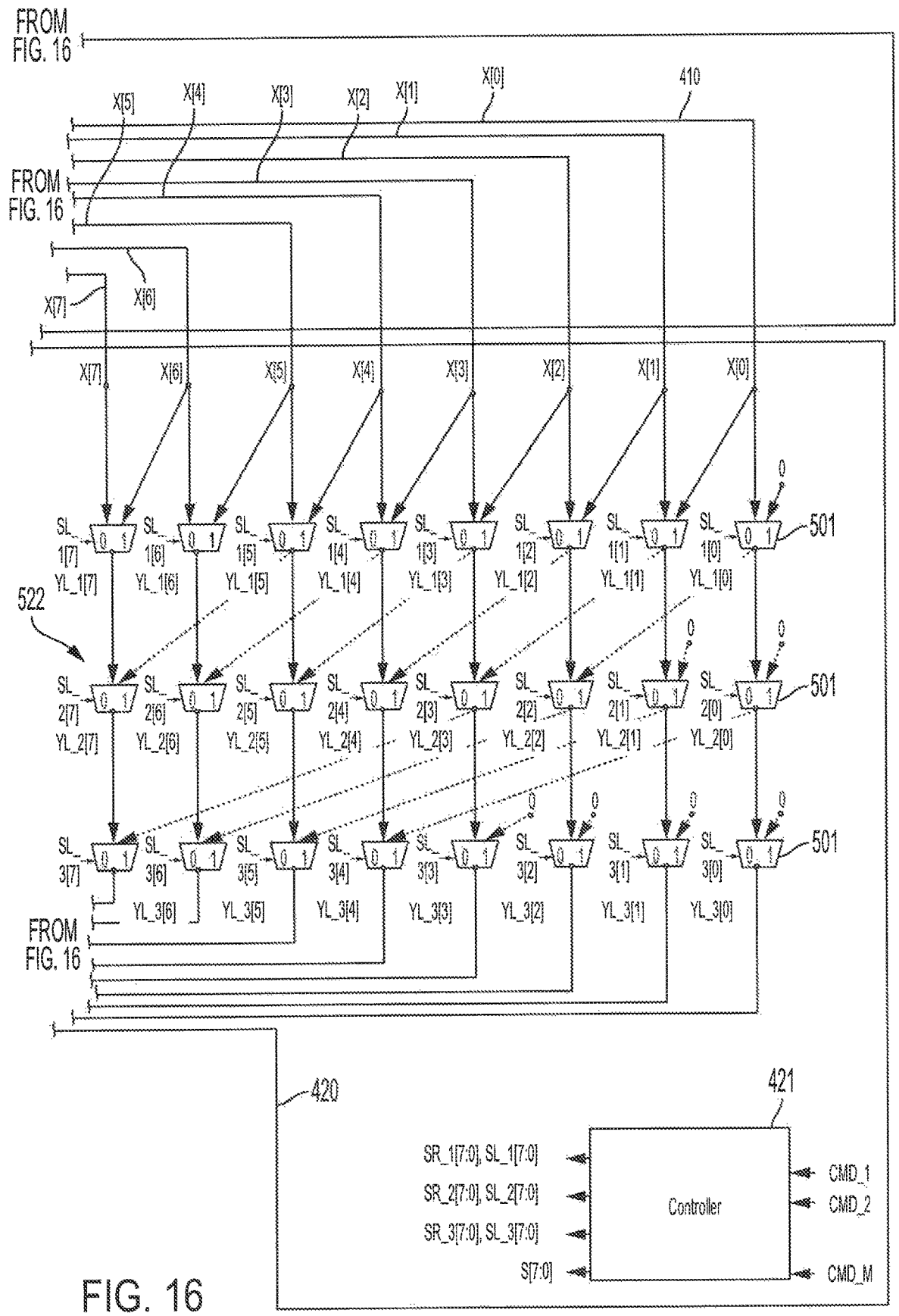

FIG. 16 shows details of an embodiment of reconfigurable segmented scalable shifter 400 as may be configured to provide data shifting in accordance with examples discussed above. In particular, reconfigurable segmented scalable shifter 400 of FIG. 16 illustrates an 8 bit shifter configuration in which input stage 410 is configured to provide input data to both right shifter portion 521 and left shifter portion 522 of shifter stage 420 to thereby facilitate accommodation of reconfigurable shifter operation to support various types of data shifting (e.g., cyclic shifts, arithmetic shifts, and/or logical shifts, as shown in the above examples). Shifter stage 420 of FIG. 16 includes an array of multiplexers 501 disposed in 3 stages of a logarithmic shifter configuration and responsive to control signals (e.g., SR and/or SL control signals, as shown in the above examples) provided by controller 421 to facilitate reconfigurable data shifting operation. In order to simplify reconfigurable segmented scalable shifter 400 as shown in FIG. 16, output stage 430 is shown in a cyclic shift implementation configuration. That is output stage 430 of the illustrated embodiment includes an array of multiplexers 602 responsive to control signals (e.g., S[i] output selection control signals, as shown in the above examples) provided by controller 421 to facilitate merging the results of right shifter portion 521 and left shifter portion 522 to provide cyclic shift results.

Figure 17A:
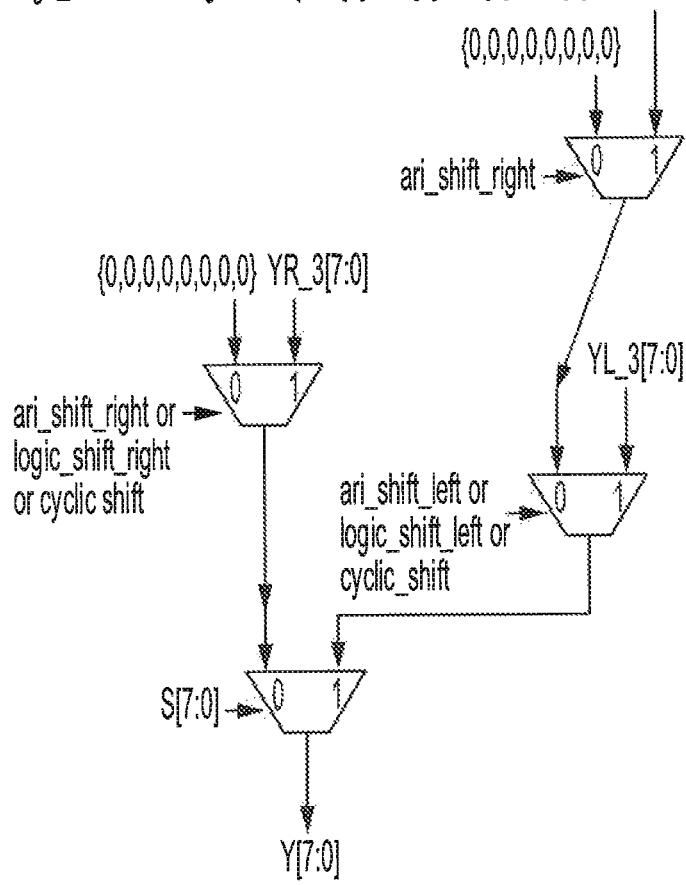
FIGS. 17A-17F show a configuration of controllable data path elements as may be utilized in an output stage of a reconfigurable segmented scalable shifter supporting cyclic shifts, arithmetic shifts, and logical shifts according to embodiments of the invention.
Figure 17B:
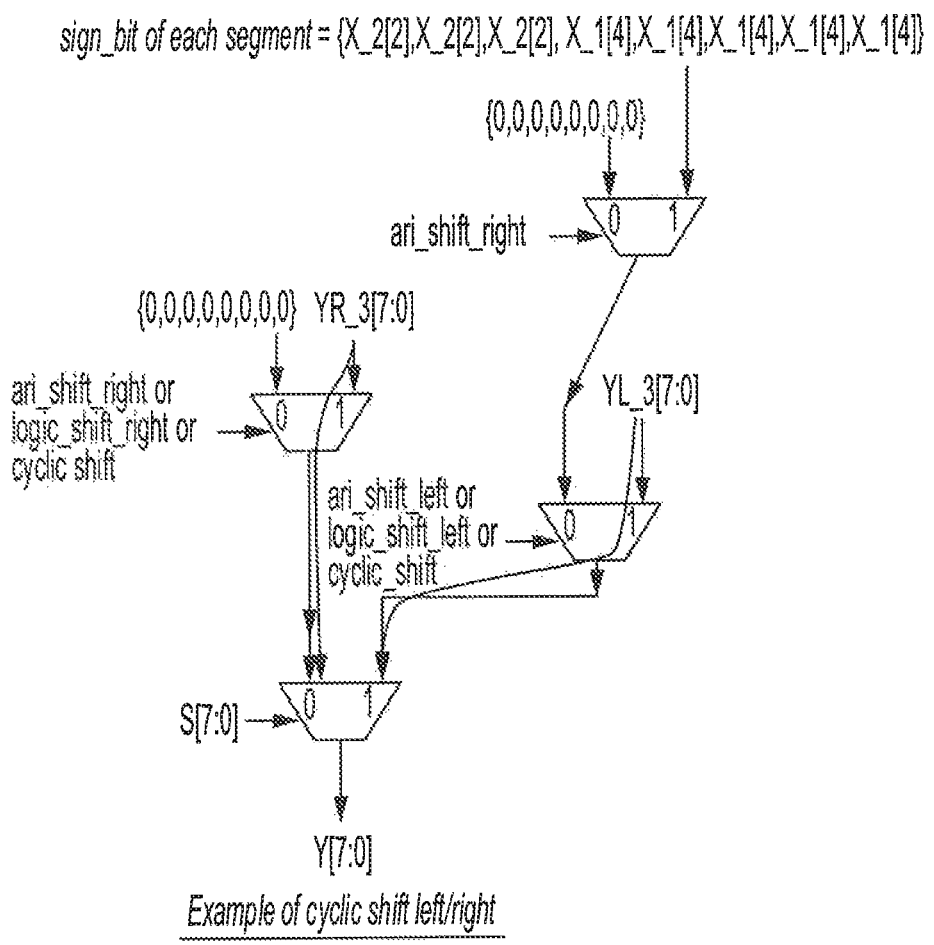
Figure 17C:
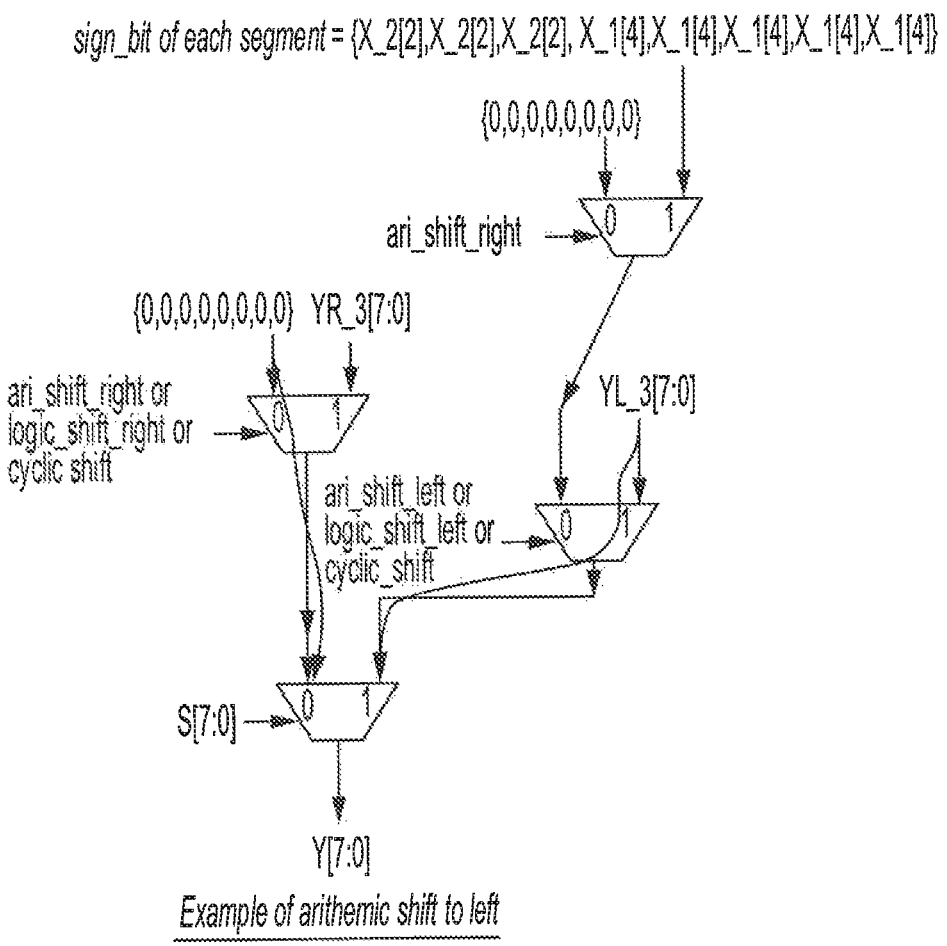
Figure 17D:
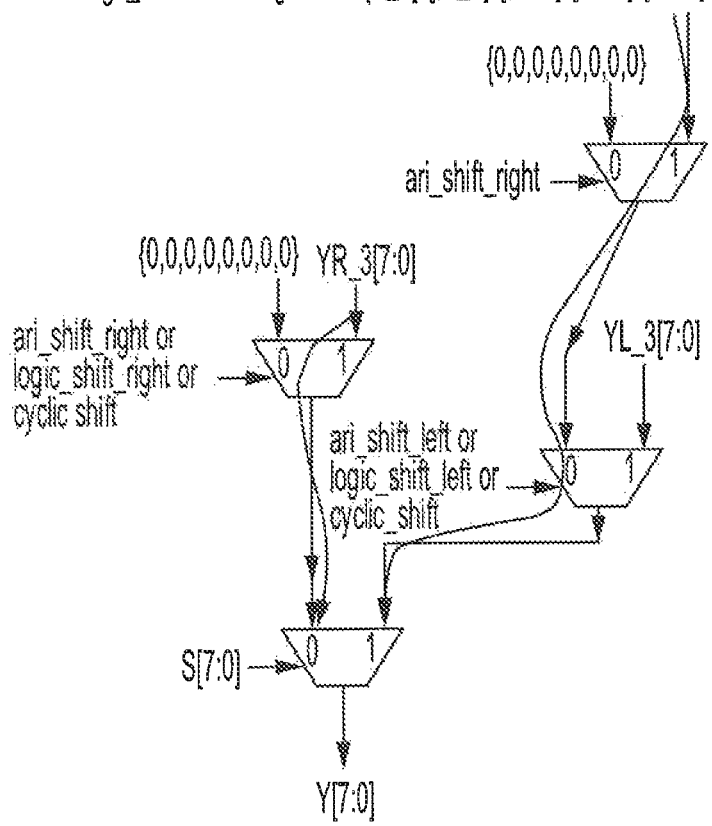
Figure 17E:
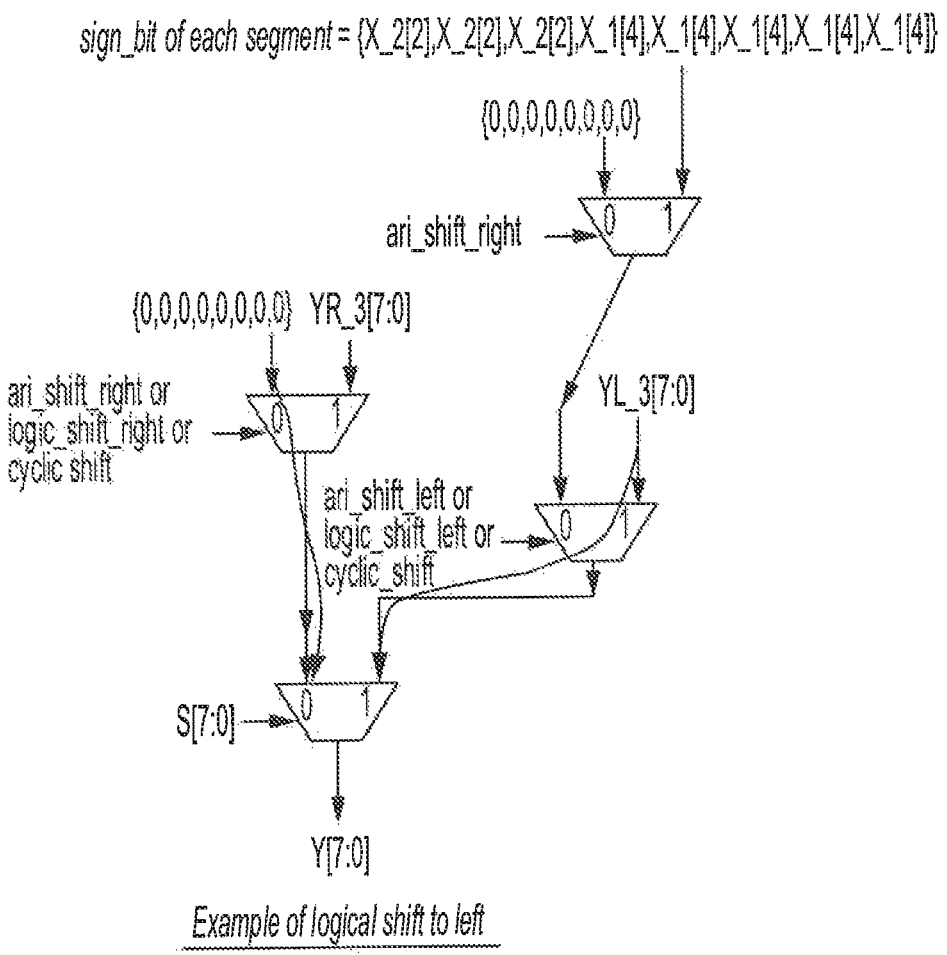
Figure 17F:
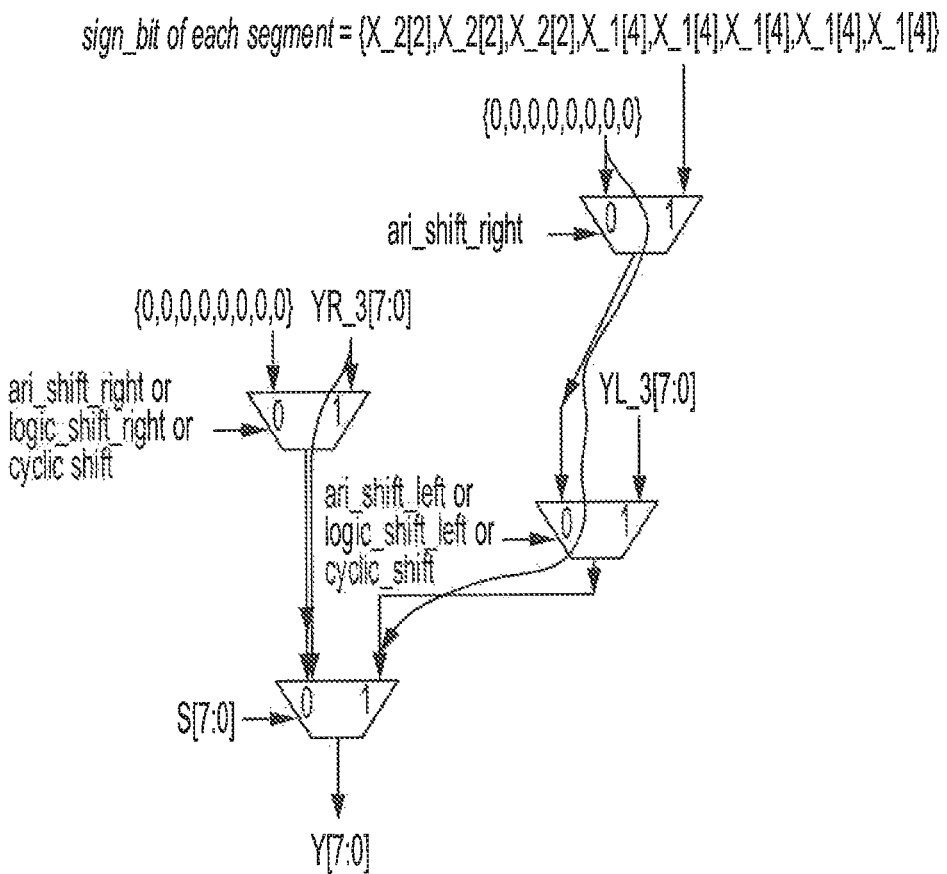

It should be readily understood from the above cyclic shift, arithmetic shift, and logical shift examples that the logic of shifter stage 420 may support each of these data shift types where output stage 430 is adapted to merge outputs of the right shift portion and left shift portion (e.g., cyclic shift), tie certain outputs to a sign-bit (e.g., right arithmetic shift), and tie certain outputs to 0 (e.g., left arithmetic shift and logical shift) as appropriate (e.g., based upon shift type and/or shift direction). FIG. 17A shows a configuration of controllable data path elements as may be utilized in output stage 430 to facilitate embodiments of reconfigurable segmented scalable shifter 400 supporting arithmetic shifts. An instance of the multiplexer circuit of FIG. 17A may, for example, be utilized in place of each of multiplexers 602 shown in output stage 430 to provide an output stage configuration supporting cyclic shifts, arithmetic shifts, and logical shifts (e.g., to control merging of data from shifter stage 420 and/or replacing particular bits with a respective sign bit or 0, as appropriate to the shift type being implemented). Controller 421 may accordingly provide output selection control signals S[i] for the particular shift type being implemented, as shown in the examples above. As shown in FIGS. 17B-17F, the shifters of the configuration of FIG. 17A may be controlled to provide cyclic shifts (FIG. 17B), arithmetic shifts (FIGS. 17C and 17D), and logical shifts (FIGS. 17E and 17F).

As can be seen from the above examples, reconfigurable segmented scalable shifter 400 of embodiments is reconfigurable for scalability in supporting data shifting with respect to various bit lengths of data and supports data shifting of differing bit lengths in parallel. For example, shifters of embodiments are reconfigurable with respect to a number of segments (M) (e.g., 1≤M≤N), a size of each segment (N_m) (e.g., N≥N_m≥1), a shift value of each segment (S) (1≤S≤N), a shift direction (D) of each segment (e.g., D is left or right), and/or a shift type (T) of each segment (e.g., T is logical, arithmetic, or cyclic). In the examples of reconfigurable segmented scalable shifter 400 discussed above, segmentation is implemented for data shifting with respect to differing bit lengths, wherein individual data shift control is provided with respect to each path of a data shifter stage to implement different data shift commands for the segments and control multiple data shifts in parallel. Embodiments of a reconfigurable segmented scalable shifter in accordance with the concepts herein may be implemented to accommodate relatively large data widths (e.g., N=384 for a 5G QC-LDPC decoder implementation). Accordingly, the control signal structure may become relatively complicated as configurations of a reconfigurable segmented scalable shifter are scaled up for such implementations. Embodiments may thus implement a less complicated shifter stage configuration which nevertheless is reconfigurable for scalability in supporting data shifting with respect to various bit lengths of data and supports data shifting of differing bit lengths in parallel.

Figure 18:
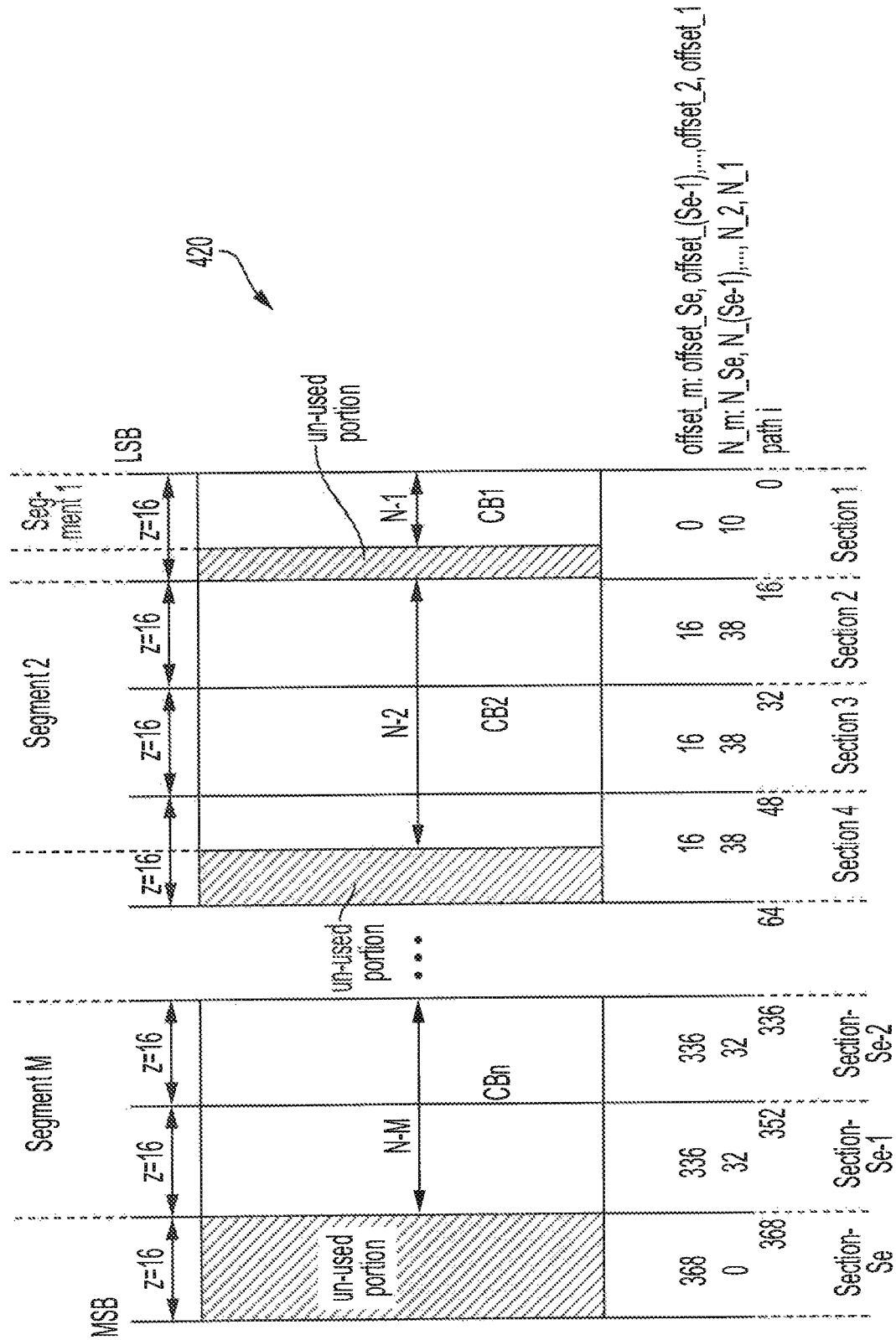
FIG. 18 shows a sectioned shifter stage configuration of a reconfigurable segmented scalable shifter of embodiments of the invention.

FIG. 18 illustrates a sectioned shifter stage configuration which is readily scalable to accommodate large data widths. Shifter stage 420 shown in FIG. 18 implements a sectioned configuration in which each of the left shift and right shift portions (either one of which is represented in the illustration) are divided into multiple sections, wherein the data paths of each section share the same control signals. For example, the shifter may be divided into a plurality of sections of equal data widths, different data widths, or a combination thereof where, although each section may be controlled individually to provide different data shifting (e.g., direction and/or shift value), all data of a section controlled together for same data shifting (e.g., direction and shift value). Such configurations may, for example, provide a satisfactory tradeoff between the number of segments and hardware cost.

Segmentation for data shifting with respect to differing bit lengths may be implemented by configuring a group of one or more sections for each segment, wherein the group of sections for a particular segment provides an aggregate data width equal to or greater than the data width of the segment. Accordingly, one or more messages of various data widths from input data may be provided data shifting in each segment as hosted by a respective group of one or more sections, wherein the messages may be provided individual data shifting in parallel through appropriately controlling the sections for each segment.

The number of sections (Se) and the section data width (W) are preferably related to the shifter data width (N) so that the total data width is sectioned (e.g., N=Se*W). In the exemplary embodiment of shifter stage 420 shown in FIG. 18, the shifter data width N=384, the number of sections Se=24, and the data width of each section W=16 (e.g., 384=24*16). M number of segments may be hosted by various groups of sections of shifter section 420, wherein the number of segments is less than or equal to the shifter data width (e.g., 1≤M≤N) and the aggregate size of the segments is less than or equal to the shifter data width (e.g., $N\_1+N\_2+ \ldots N\_M \leq N$).

In accordance with embodiments of the invention, a segment is aligned with the LSB of a first section of the corresponding group of sections and any portion of the aggregate data width of the group of sections which exceeds the corresponding section bit width remains unused at the MSB end of the last section of the group of sections. This configuration is illustrated in FIG. 18, wherein M segments (e.g., segment 1, segment 2, . . . segment M) of different data widths are hosted by corresponding groups of sections of shifter stage 420.

As shown in the example of FIG. 18, the N_1 number of bits of message X_1 is less than the section data width W (e.g., N_1=10 and W=16), and thus the group of sections hosting segment 1 comprises section 1, wherein the LSB of message X_1 aligns with the LSB position of section 1 and a portion of the data width of section 1 greater than the number of bits of message X_1 remains unused (e.g., (1*16)−10=6 unused bits). Each shifter data path of section 1 of embodiments is controlled using same control signals. Thus a single instance of control signals is used to provide data shifting for segment 1 (e.g., as opposed to 10 separate data shift path control signals as may be implemented by examples shown above).

In contrast to exemplary message X_1, the N_2 number of bits of message X_2 is greater than the section data width W (e.g., N_2=38 and W=16), and thus the group of sections hosting segment 2 comprises section 2, section 3, and section 4 (e.g., CEILING.MATH(38/16)=3 sections), wherein the LSB of message X_2 aligns with the LSB position of section 2 (the first section of the segment) and a portion of the aggregate data width of the sections greater than the number of bits of message X_2 remains unused in section 4 (the last section hosting the segment) (e.g., (3*16)−38=10 unused bits). Each shifter data path of section 2 of embodiments is controlled using same control signals, each shifter data path of section 3 of embodiments is controlled using same control signals, and each shifter data path of section 4 of embodiments is controlled using same control signals. Thus 3 instances of control signals (e.g., an instance of control signals for each section hosting the segment) are used to provide data shifting for segment 2 (e.g., as opposed to 38 separate data shift path control signals as may be implemented by examples shown above).

The N_M number of bits of message X_M is an integer multiple of the section data width W (e.g., N_M=32 and W=16), and thus the group of sections hosting segment M comprises section Se-2 and section Se-1 (e.g., CEILING.MATH(32/16)=2 sections), wherein the LSB of message X_M aligns with the LSB position of section Se-2 (the first section of the segment) and the MSB of message X_M aligns with the MSB position of section Se-1 (the last section hosting the segment) (e.g., (2*16)−32=0 unused bits). Each shifter data path of section Se-2 of embodiments is controlled using same control signals and each shifter data path of section Se-1 of embodiments is controlled using same control signals. Thus 2 instances of control signals (e.g., an instance of control signals for each section hosting the segment) are used to provide data shifting for segment M (e.g., as opposed to 32 separate data shift path control signals as may be implemented by examples shown above).

Figure 19:
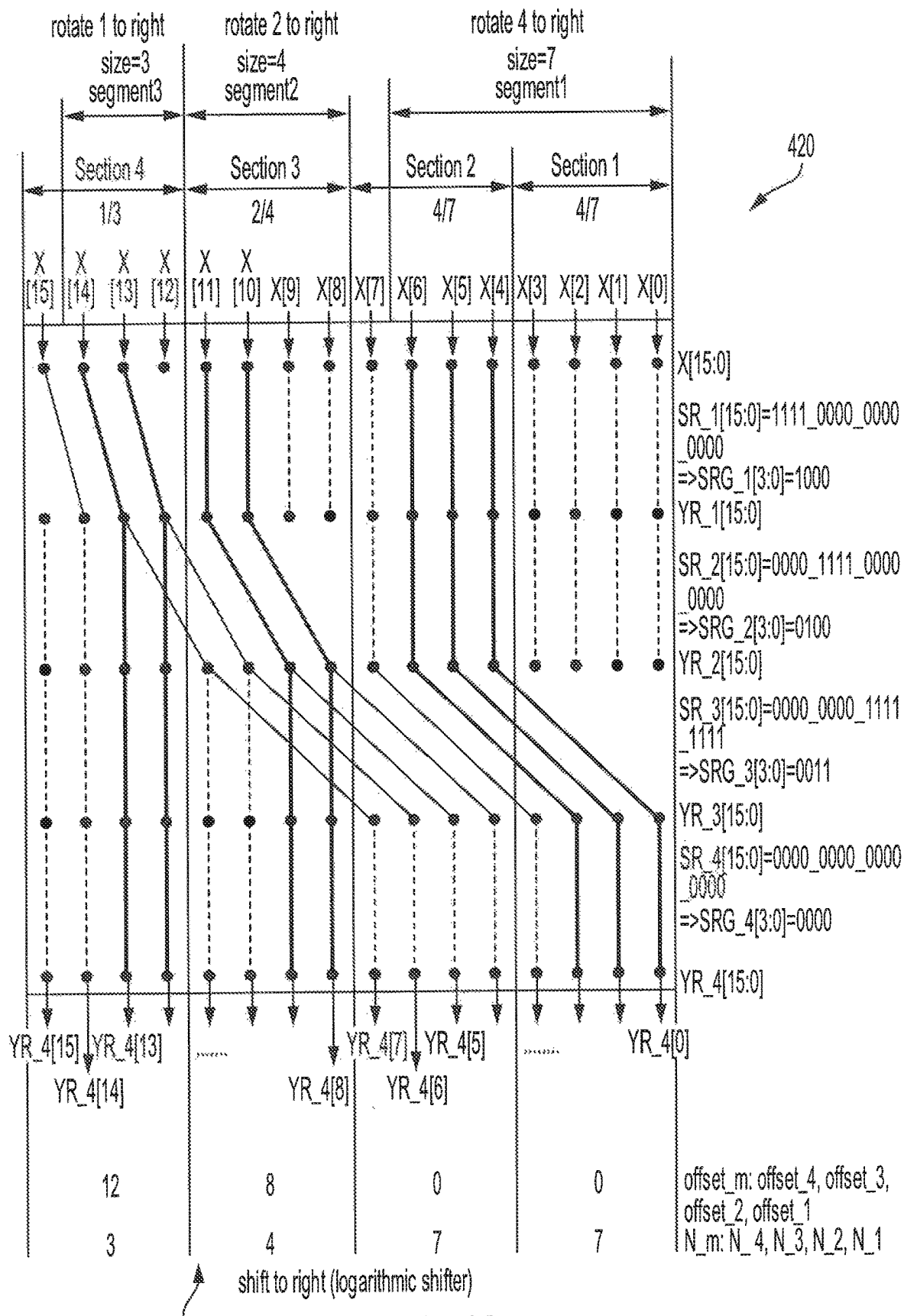
FIG. 19 shows details of a reconfigurable segmented scalable shifter implementing sections according to embodiments of the invention.
Figure 19:
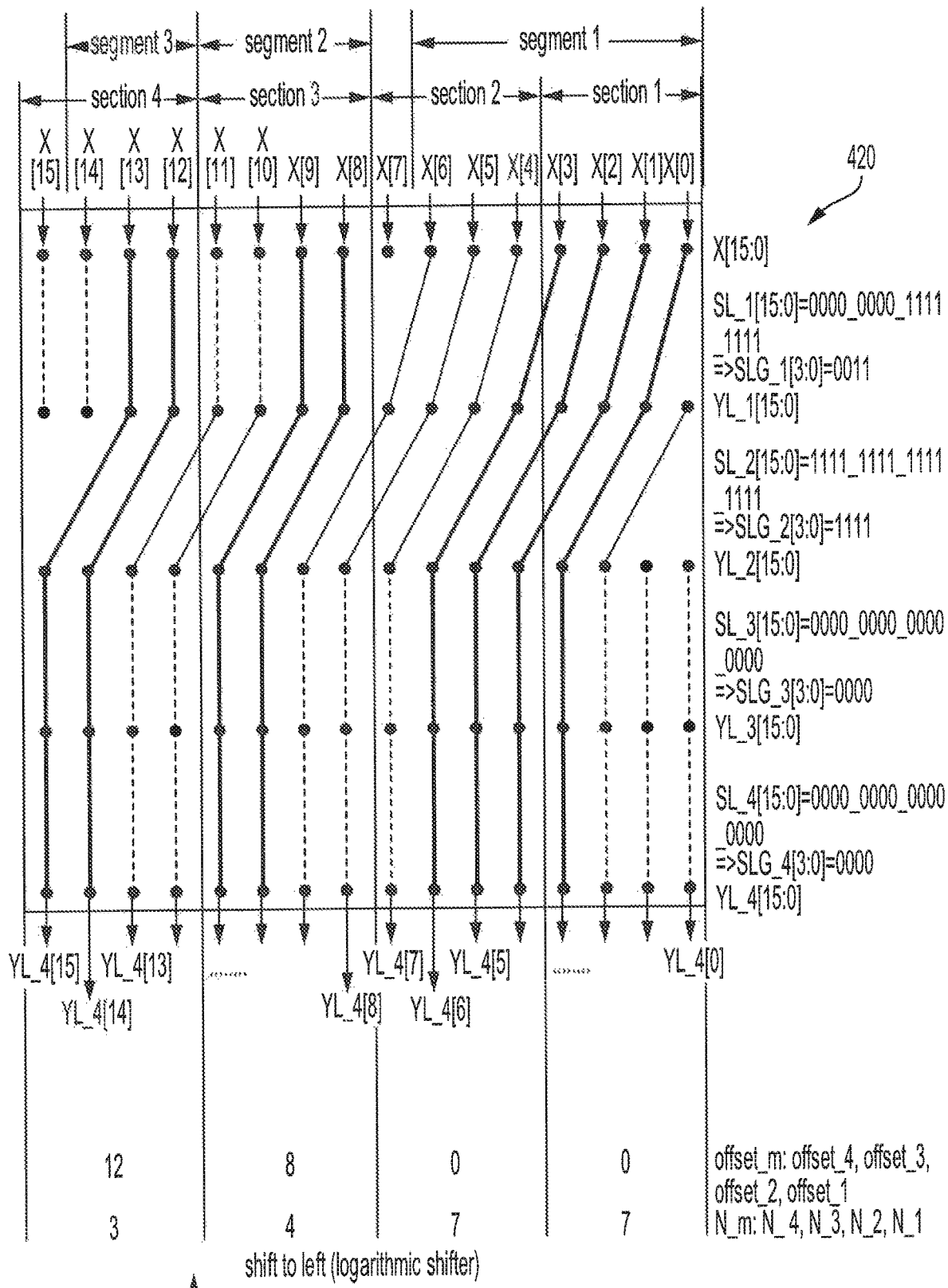

FIG. 19 shows an example of a shifter stage, as may be utilized in a sectioned embodiment of the reconfigurable segmented scalable shifter of FIG. 18, implemented using a logarithmic shifter configuration. The data width of the shifter illustrated in FIG. 19 is 16, wherein 4 sections of 4 bits are implemented (e.g., N=16, Se=4, and W=4). The number of stages of the logarithmic shifter is K=ceil[log 2(N)], wherein in the exemplary embodiment N=16, and thus K=log 2(8)=4. The 4 stages of a logarithmic shifter are shown in right shift portion 1921 and left shift portion 1922 of shifter stage 420 illustrated in FIG. 19, wherein YR_1[15:0]=output of stage 1 of the right shift portion, YR_2[15:0]=output of stage 2 of the right shift portion, YR_3[15:0]=output of stage 3 of the right shift portion, YR_4[15:0]=output of stage 4 of the right shift portion, YL_1[15:0]=output of stage 1 of the left shift portion, YL_2[15:0]=output of stage 2 of the left shift portion, YL_3[15:0]=output of stage 3 of the left shift portion, and YL_4[15:0]=output of stage 4 of the left shift portion.

In the embodiment shown in FIG. 19, shifter stage 420 is configured as a 16 bit, 4 section, 3 segment implementation wherein segment 1 provides a 4 bit right cyclic shift with respect to a 7 bit message using section 1 and section 2, segment 2 provides a 2 bit right cyclic shift with respect to a 4 bit message using section 3, and segment 3 provides a 1 bit right cyclic shift with respect to a 3 bit message using section 4 (e.g., shifter size N=16, number of sections Se=4, section data width W=4, number of segments M=3, segment 1 size N_1=7, segment 1 shift value S_1=4, segment 1 shift direction D_1=Right, segment 1 shift type T_1=Cyclic, and segment 1 section group=[section 1, section 2], segment 2 size N_2=4, segment 2 shift value S_2=2, segment 2 shift direction D_2=Right, segment 2 shift type T_2=Cyclic), and segment 2 section group=[section 3], and segment 3 size N_3=3, segment 3 shift value S_3=1, segment 3 shift direction D_3=Right, segment 3 shift type T_3=Cyclic), and segment 3 section group=[section 4]).

It should be appreciated that, although the example of FIG. 19 shows a configuration in which each segment implements a same type of shift (e.g., cyclic) and a shift in the same direction (e.g., right), there is no limitation with respect to such a configuration according to embodiments of the invention. For example, a reconfigurable segmented scalable shifter of embodiments may be configured to provide different sizes of segments, different shift directions by the segments, different shift values by the segments, and/or different types of shifts by the segments.

The input data (X) of the example of FIG. 19 comprises 16 bits, wherein the input data may be represented as X[15:0] (e.g., X[15:0]={X[15], X[14], . . . X[0]}) and the output data may be represented as Y[15:0] (e.g., Y[15:0]={Y[15], Y[14], . . . Y[0]}). In the example of FIG. 19 the number of segments (M) is 3, wherein segment 1 comprises 7 bits, segment 2 comprises 4 bits, and segment 3 comprises 3 bits such that X_1[6:0] is the input of segment 1, X_2[3:0] is the input of segment 2, and X_3[2:0] is the input of segment 3, and Y_1[6:0] is the output data of segment 1, Y_2[3:0] is the output data of segment 2, and Y_3[2:0] is the output data of segment 3. The section group hosting segment 1 is section 1 and section 2, the section group hosting segment 2 is section 3, and the section group hosting segment 3 is section 4. Accordingly, implementing offsets for the segment and section mapping (e.g., offset_m: offset_4, 3, 2, 1, N−m: N_4, 3, 2, 1, wherein offset_m is the value of the beginning path i of each segment), X_1[6:0]={X[6], X[5], X[4], X[3], X[2], X[1], X[0]}, X_2[3:0]={X[11], X[10], X[9], X[8]}, and X_3[2:0]={X[14], X[13], X[12]}. Similarly, again implementing offsets for the segment and section mapping, Y_1[6:0]={Y[6], Y[5], Y[4], Y[3], Y[2], Y[1], Y[0]}, Y_2[3:0]={Y[11], Y[10], Y[9], Y[8]} and Y_3[2:0]={Y[14], Y[13], Y[12]}.

In this segmented example, SR1=4=4'b0100 (i.e., segment 1 shift value S_1=4 and segment 1 shift direction D_1=Right), SR2=2=4'b0010 (i.e., segment 2 shift value S_2=2, segment 2 shift direction D_2=Right), and SR3=1=4'b0001 (i.e., segment 3 shift value S_3=1, segment 3 shift direction D_3=Right). This segmented example provides cyclic shifts, and thus left data shifting is utilized to provide the cyclic aspect of the data shift. In this example, SL1=7-4=3=4'b0011 (i.e., segment 1 size N_1=7, segment 1 shift value S_1=3, and segment 1 shift type T_1=Cyclic), SL2=4-2=2=4'b0010 (i.e., segment 2 size N_2=4, segment 2 shift value S_2=2, and segment 2 shift type T_2=Cyclic), and SL3=3-1=2=4'b0010 (i.e., segment 3 size N_3=3, segment 3 shift value S_3=1, and segment 3 shift type T+3=Cyclic). Using the individual data shifter path control of the previous examples, the control signals for the stages of the segmented shifter may be represented as SR_1[15:0]= 1111_0000_0000_0000 (stage 1), SR_2[15:0]= 0000_1111_0000_0000 (stage 2), SR_3[15:0]= 0000_0000_1111_1111 (stage 3), and SR_4[15:0]= 0000_0000_0000_0000 (stage 4) for the right shift portion and SL_1[15:0]=0000_0000_1111_1111 (stage 1), SL_2[15:0]=1111_1111_1111_1111 (stage 2), SL_3[15:0]= 0000_0000_0000_0000 (stage 3), and SL_4[15:0]= 0000_0000_0000_0000 for the left shift portion.

This embodiment, however, implements grouping by sections and thus the control signals may be simplified to SRG_1[3:0]=1000 (stage 1), SRG_2[3:0]=0100 (stage 2), SRG_3[3:0]=0011 (stage 3), and SRG_4[3:0]=0000 (stage 4) for the right shift portion and SLG_1[3:0]=0011 (stage 1), SLG_2[3:0]=1111 (stage 2), SLG_3[3:0]=0000 (stage 3), and SLG_4[3:0]=0000 (stage 4) for the left shift portion. It can be appreciated that segmented data shifting is provided for the 7 bits of segment 1 served by section 1 and section 2 by the right most 2 bits of each of the foregoing control signals, for the 4 bits of segment 2 served by section 3 by the third from the right bit of each of the foregoing control signals, and for the 3 bits of segment 3 served by section 4 by the left most bit of each of the foregoing control signals.

Figure 20:
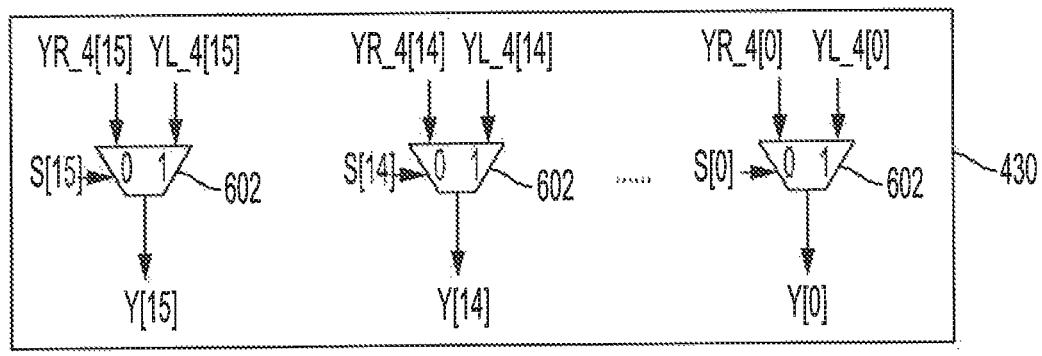
FIG. 20 shows an output stage configured to merge results of a right shifter portion and left shifter portion to provide cyclic shift results according to embodiments of the invention.

Output stage 430 of embodiments operates to merge the results of right shifter portion 1921 and left shifter portion 1922 to provide the cyclic shift results, wherein the unused portion any section is discarded. Accordingly, output stage 430 may comprise instances of multiplexer 602 disposed at the corresponding outputs of each path of right shift portion 1921 and left shift portion 1922 and provided with a control signal to select output of either right shifted data or left shifted data, as shown in the version of output stage 430 FIG. 20 scaled for the 16 data width of shifter stage 420 of FIG. 19. The merging of the shifter results may be controlled by an output selection control signal S[i], wherein S[i]=1 if(SL+offset_m)≥SL. Although not shown in order to simplify the illustration, it should be appreciated that output stage 430 of this embodiment may include a configuration of controllable data path elements corresponding to that of FIG. 17A to facilitate embodiments of reconfigurable segmented scalable shifter 400 supporting cyclic shifts, arithmetic shifts, and logical shifts.

Although the example of FIGS. 18 and 19 shows reconfigurable segmented scalable shifters configured for the data width or size of the input data (e.g., segment 1 input X_1, segment 2 input X_2, and segment 3 input X_3 of FIG. 19) being different, it should be appreciated that the data width or size of all input data may be the same (e.g., segment 1 input X_1 data width=segment 2 input X_2 data width=segment 3 input X_3 data width) according to embodiments of the invention. In accordance with some embodiments configured for the same data width of all input data, the control signals of every stage for all sections of a shifter stage may be the same (e.g., where the same shift is provided with respect to each input message) or the size of the control signals of every stage for all sections of a shifter stage may be the same, although the control signals themselves may differ, (e.g., where different shifts are provided with respect to some or all input messages).

It should be appreciated that, although the sections of the example sectioned reconfigurable segmented scalable configuration of FIGS. 18 and 19 comprise a same data width, embodiments may comprise sections of different data widths. For example, each of section 1 through section Se of FIG. 18 may be of different data widths. As another example, some sections of section 1 through section Se may be of different data widths while other sections of section 1 though section Se may be of the same data width.

As can be appreciated from the above described example, sectioned embodiments of a reconfigurable segmented scalable shifter may combine a plurality of successive sections to form a data shifter for accommodating data widths larger than the individual sections. Such reconfigurable segmented scalable shifter configurations provide for fully reconfigurable data width and shift command of each message of input data for flexible and efficient utilization of hardware for parallel processing data input of various bit lengths.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A reconfigurable segmented scalable shifter comprising:
   a shifter stage having N-bit data input, N-bit data output, and control signal input, wherein the shifter stage is configured to implement different data shifts for multiple data segments of the N-bit data input in parallel in response to a plurality of individual shifting commands of a control signal, and
   a controller coupled to the control signal input of the shifter stage, wherein the controller is configured to provide the plurality of individual shifting commands to the shifter stage, wherein each shifting command of the plurality of individual shifting commands implements a different data shift of the different data shifts for the multiple data segments of the N-bit data input, and wherein the different data shifts implemented by the shifter stage in accordance with the plurality of individual shifting commands provide shifted N-bit data at the N-bit data output having the different data shifts for the multiple data segments.

2. The reconfigurable segmented scalable shifter of claim 1, wherein the plurality of individual shifting commands include a control signal for individually controlling each data path of the shifter stage.

3. The reconfigurable segmented scalable shifter of claim 1, wherein data paths of the shifter stage are subdivided into a plurality of sections each including a plurality of data paths, wherein the plurality of individual shifting commands include a control signal for individually controlling each section of the plurality of sections, and wherein each data path of the plurality of data paths of a section is controlled by a same control signal of the plurality of individual shifting commands.

4. The reconfigurable segmented scalable shifter of claim 3, wherein the plurality of sections comprises S number of sections, wherein a data width of each section is W-bits, and wherein N=S*W.

5. The reconfigurable segmented scalable shifter of claim 4, wherein each data segment of the multiple data segments starts from a least significant bit (LSB) of a section.

6. The reconfigurable segmented scalable shifter of claim 3, wherein two or more sections of the plurality of sections have a different data width with respect to each other.

7. The reconfigurable segmented scalable shifter of claim 1, wherein the shifter stage comprises a shifter architecture selected from the group consisting of a logarithmic shifter configuration, a barrel shifter configuration, and a combinational shifter configuration.

8. The reconfigurable segmented scalable shifter of claim 1, wherein the multiple different data shifts implemented in parallel include different data shifts selected from the group consisting of different data shift direction for a first segment and a second segment of the multiple data segments, different shift type for the first segment and the second segment, and different shift value for the first segment and the second segment.

9. The reconfigurable segmented scalable shifter of claim 8, wherein the first segment and second segment have different data widths.

10. The reconfigurable segmented scalable shifter of claim 1, wherein each segment of the multiple data segments has a same data width.

11. The reconfigurable segmented scalable shifter of claim 1, further comprising:
    an N-bit data output stage coupled to the N-bit data output of the shifter stage, wherein the N-bit data output stage is configured to select data for output based upon data shifting types of the multiple different data shifts.

12. The reconfigurable segmented scalable shifter of claim 11, wherein the data shifting types are selected from the group consisting of arithmetic shift, logical shift, and cyclic shift.

13. The reconfigurable segmented scalable shifter of claim 11, wherein each individual shifting command of the plurality of individual shifting commands of the control signal includes a shift value signal and an output selection signal, wherein a shift value for an individual shifting command specifies an amount of shift provided by the shifter stage for a respective data shift of the multiple different data shifts, and wherein the output selection signal selects data for output corresponding to a data shifting type for the respective data shift of the multiple different data shifts.

14. The reconfigurable segmented scalable shifter of claim 13, wherein the output selection signal controls the N-bit data output stage to select a sign bit for output instead of an output of the shifter stage when the data shift type is an arithmetic shift and the shift direction is right, to select a 0 bit value for output instead of an output of the shifter stage when the data shift type is an arithmetic shift and the shift direction is left, to select a 0 bit value for output instead of an output of the shifter stage when the data shift type is a logical shift and the shift direction is right, and to select a 0 bit value for output instead of an output of the shifter stage when the data shift type is a logical shift and the shift direction is left.

15. The reconfigurable segmented scalable shifter of claim 13, wherein the shifter stage comprises:
    a right shift portion, wherein the shift value signal for each individual shifting command of the plurality of individual shifting commands includes a right shift value to control a right shift aspect of the right shift portion for a respective data shift of the multiple different data shifts; and
    a left shift portion, wherein the shift value signal for each individual shifting command of the plurality of individual shifting commands includes a left shift value to control a left shift aspect of the left shift portion for a respective data shift of the multiple different data shifts.

16. The reconfigurable segmented scalable shifter of claim 15, wherein the right shift portion and the left shift portion each has K stages, where K=ceiling(log 2(N)).

17. The reconfigurable segmented scalable shifter of claim 15, further comprising:
    an N-bit data input stage coupled to the N-bit data input of the shifter stage, wherein the N-bit data input stage is configured to provide N-bit input data comprising the multiple data segments to both the right shift portion and the left shift portion of the shifter stage.

18. A method comprising:
providing, by a controller coupled to a control signal input of a shifter stage of a reconfigurable segmented scalable shifter, a control signal having a plurality of individual shifting commands each controlling a different data shift of different data shifts for multiple data segments of N-bit data input to the shifter stage; and
implementing, by the shifter stage in response to the control signal, different data shifts for the multiple data segments of the N-bit data input in parallel.

19. The method of claim 18, wherein the plurality of individual shifting commands include a control signal for individually controlling each data path of the shifter stage.

20. The method of claim 18, wherein data paths of the shifter stage are subdivided into a plurality of sections each including a plurality of data paths, wherein the plurality of individual shifting commands include a control signal for individually controlling each section of the plurality of sections, and wherein each data path of the plurality of data paths of a section is controlled by a same control signal of the plurality of individual shifting commands.

21. The method of claim 20, wherein the plurality of sections comprises S number of sections, wherein a data width of each section is W-bits, and wherein N=S*W.

22. The method of claim 21, wherein each data segment of the multiple data segments starts from a least significant bit (LSB) of a section.

23. The method of claim 20, wherein two or more sections of the plurality of sections have a different data width with respect to each other.

24. The method of claim 18, wherein the multiple different data shifts implemented in parallel include different data shifts selected from the group consisting of different data shift direction for a first segment and a second segment of the multiple data segments, different shift type for the first segment and the second segment, and different shift value for the first segment and the second segment.

25. The method of claim 24, wherein the first segment and second segment have different data widths.

26. The method of claim 18, wherein each segment of the multiple data segments has a same data width.

27. The method of claim 18, further comprising:
selecting, by an N-bit data output stage coupled to the shifter stage, data for output based upon data shifting types of the multiple different data shifts.

28. The method of claim 27, wherein each individual shifting command of the plurality of individual shifting commands of the control signal includes a shift value signal and an output selection signal, wherein a shift value for an individual shifting command specifies an amount of shift provided by the shifter stage for a respective data shift of the multiple different data shifts, and wherein the output selection signal selects data for output corresponding to a data shifting type for the respective data shift of the multiple different data shifts.

29. The method of claim 28, wherein the output selection signal controls the N-bit data output stage to select a sign bit for output instead of an output of the shifter stage when the data shift type is an arithmetic shift and the shift direction is right, to select a 0 bit value for output instead of an output of the shifter stage when the data shift type is an arithmetic shift and the shift direction is left, to select a 0 bit value for output instead of an output of the shifter stage when the data shift type is a logical shift and the shift direction is right, and to select a 0 bit value for output instead of an output of the shifter stage when the data shift type is a logical shift and the shift direction is left.

30. The method of claim 28, further comprising:
providing, by an N-bit data input stage coupled to the shifter stage, N-bit input data comprising the multiple data segments to both a right shift portion and a left shift portion of the shifter stage.

31. A system comprising:
a shifter stage having N-bit data input, N-bit data output, control signal input, a right shift portion, and a left shift portion, wherein the shifter stage is configured to implement different data shifts for multiple data segments of the N-bit data input in parallel in response to a plurality of individual shifting commands of a control signal,
an N-bit data input stage coupled to the N-bit data input of the shifter stage, wherein the N-bit data input stage is configured to provide N-bit input data comprising the multiple data segments to both the right shift portion and the left shift portion of the shifter stage;
an N-bit data output stage coupled to the N-bit data output of the shifter stage, wherein the N-bit data output stage is configured to select data for output based upon data shifting types of the different data shifts; and
a controller coupled to the control signal input of the shifter stage, wherein the controller is configured to provide the plurality of individual shifting commands to the shifter stage, wherein each shifting command of the plurality of individual shifting commands implements a different data shift of the different data shifts for the multiple data segments of the N-bit data input, and wherein the different data shifts implemented by the shifter stage in accordance with the plurality of individual shifting commands provide shifted N-bit data at the N-bit data output having the different data shifts for the multiple data segments.

32. The system of claim 31, wherein the plurality of individual shifting commands include a control signal for individually controlling each data path of the shifter stage.

33. The system of claim 31, wherein data paths of the shifter stage are subdivided into a plurality of sections each including a plurality of data paths, wherein the plurality of individual shifting commands include a control signal for individually controlling each section of the plurality of sections, wherein each data path of the plurality of data paths of a section is controlled by a same control signal of the plurality of individual shifting commands, and wherein each data segment of the multiple data segments starts from a least significant bit (LSB) of a section.

34. The system of claim 31, wherein the multiple different data shifts implemented in parallel include different data shifts selected from the group consisting of different data shift direction for a first segment and a second segment of the multiple data segments, different shift type for the first segment and the second segment, and different shift value for the first segment and the second segment, and wherein the first segment and second segment have different data widths.

* * * * *

UNITED STATES PATENT AND TRADEMARK OFFICE
CERTIFICATE OF CORRECTION

PATENT NO. : 10,877,729 B2
APPLICATION NO. : 16/264070
DATED : December 29, 2020
INVENTOR(S) : Hing-Mo Lam et al.

It is certified that error appears in the above-identified patent and that said Letters Patent is hereby corrected as shown below:

In the Specification

At Column 8, Line number 63, delete "SR_1" and replace with --SR1--.
At Column 9, Line number 40, delete "SL_1" and replace with --SL1--.
At Column 9, Line number 48, delete "SL_[7:0]" and replace with --SL_1[7:0]--.
At Column 11, Line number 33, delete "X_[4:0])" and replace with --X_1[4:0])--.
At Column 16, Line number 28, delete "for i?SL2+5" and replace with --for i≥SL2+5--.
At Column 16, Line number 57, delete "X[O]" and replace with --X[0]--.
At Column 17, Line number 40, delete "1111_11" and replace with --1111_1111--.

Signed and Sealed this
Ninth Day of March, 2021

Drew Hirshfeld
*Performing the Functions and Duties of the
Under Secretary of Commerce for Intellectual Property and
Director of the United States Patent and Trademark Office*